(12) United States Patent
Tomita et al.

(10) Patent No.: US 6,205,082 B1
(45) Date of Patent: Mar. 20, 2001

(54) LSI DEVICE WITH MEMORY AND LOGICS MOUNTED THEREON

(75) Inventors: Hiroyoshi Tomita; Yasurou Matsuzaki; Masao Taguchi, all of Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/304,589

(22) Filed: May 4, 1999

(30) Foreign Application Priority Data

May 25, 1998 (JP) ................................................. 10-143418

(51) Int. Cl.$^7$ ...................................................... G11C 8/00
(52) U.S. Cl. ........................ 365/233; 365/63; 365/189.01
(58) Field of Search .................................. 365/51, 52, 63, 365/233, 189.01

(56) References Cited

U.S. PATENT DOCUMENTS

| | | | |
|---|---|---|---|
| 5,642,323 | * 6/1997 | Kotani et al. | 365/230.03 |
| 5,710,733 | * 1/1998 | Chengson et al. | 365/52 |
| 5,838,603 | * 11/1998 | Mori et al. | 365/63 |
| 5,867,448 | * 2/1999 | Mann | 365/233 |
| 5,983,331 | * 11/1999 | Akamatsu et al. | 711/170 |

* cited by examiner

Primary Examiner—Son Mai
(74) Attorney, Agent, or Firm—Arent Fox Kintner Plotkin & Kahn, PLLC

(57) ABSTRACT

A data signal is output from an output circuit of a first chip and sent to a data input terminal in the second chip via a data lead line based on an output clock in first chip, which is sent to the second chip. And an input circuit in a second chip receives the data signal and transfers it inside in response to a transfer clock that has been generated from the output clock in the first chip. In synchronism with a single reference clock in the first chip, therefore, a data signal can be transferred to the second chip from the first chip at a high speed.

20 Claims, 25 Drawing Sheets

Input/output circuit (1) for first embodiment

Synchronous DRAM

First embodiment
FIG. 6A    Data 10 → 20 (WRITE)
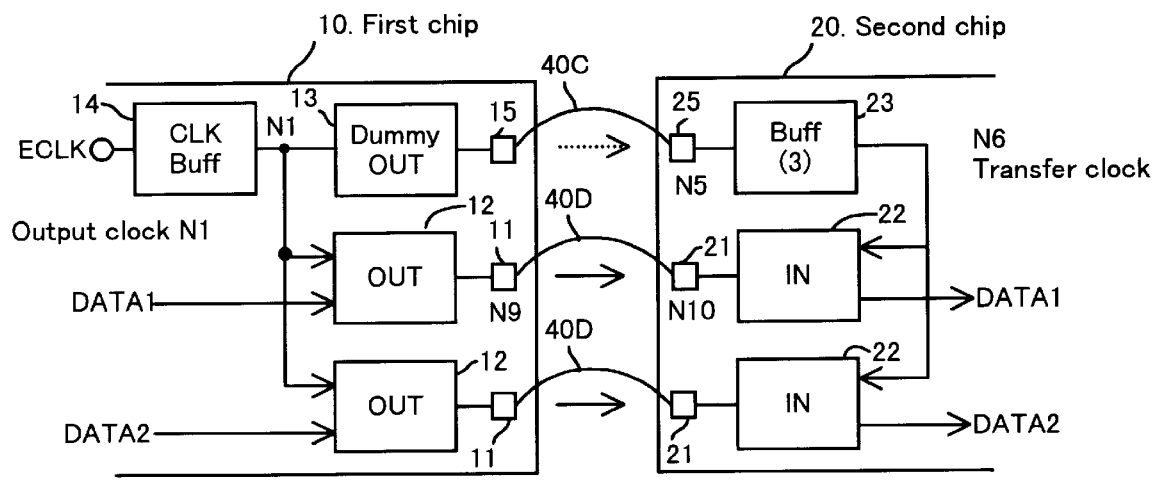
FIG. 6B    Data 10 ← 20 (READ)
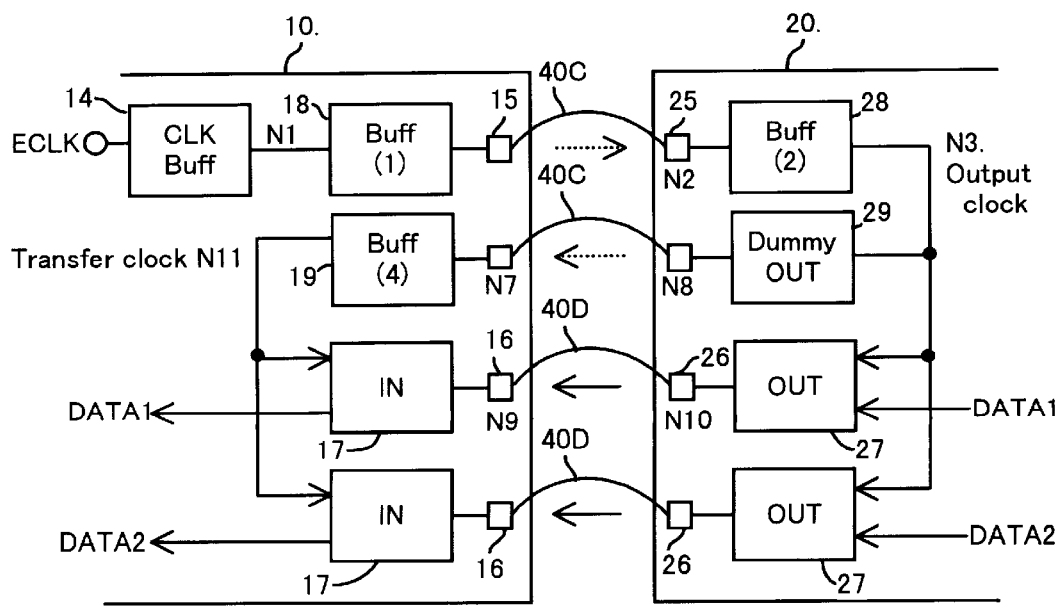

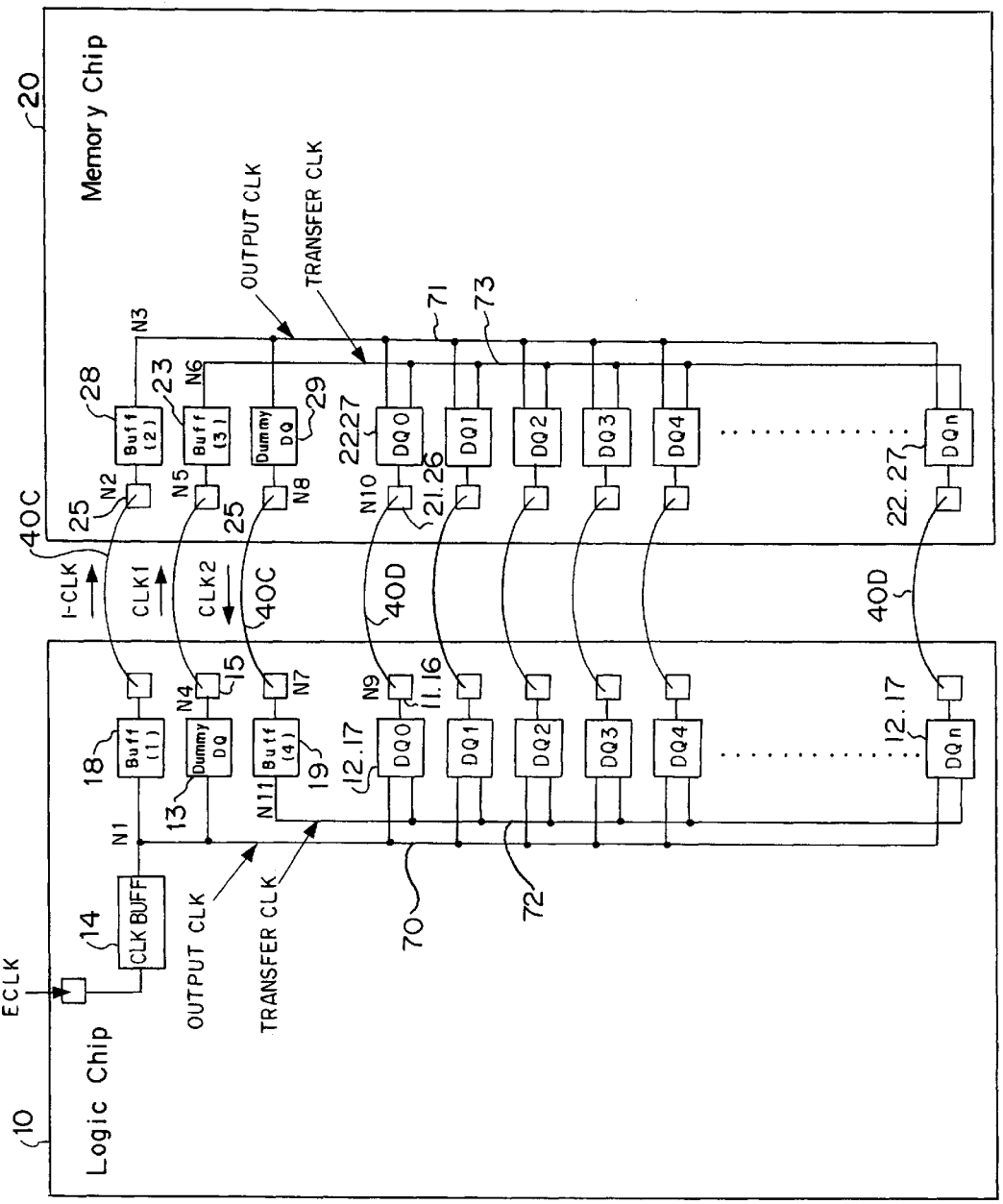

Timing chart for first embodiment

FIG. 9
Input/Output circuit DQ
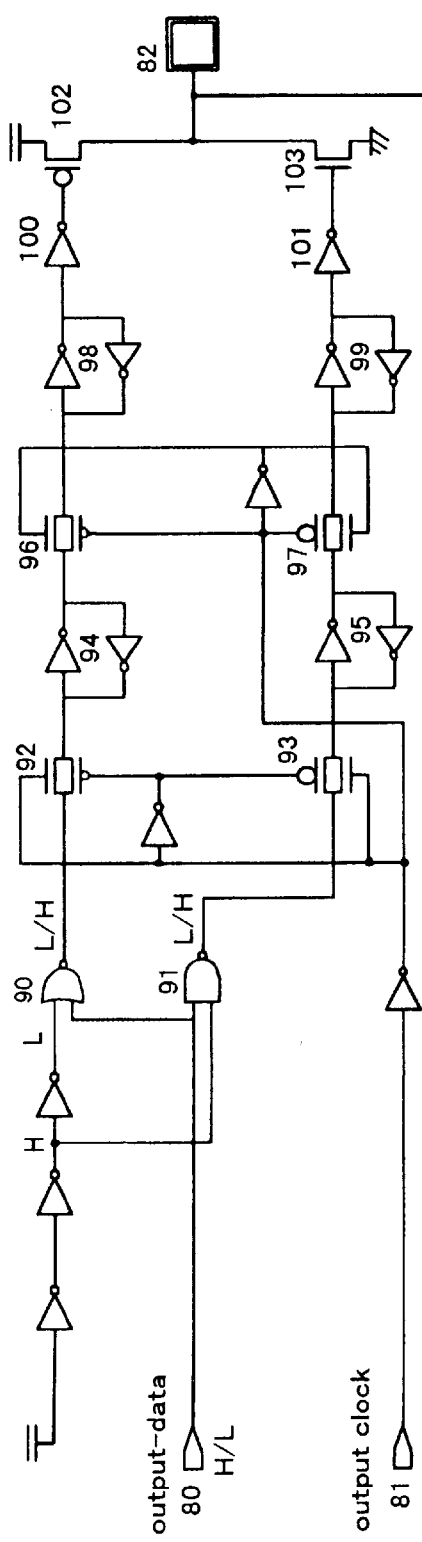
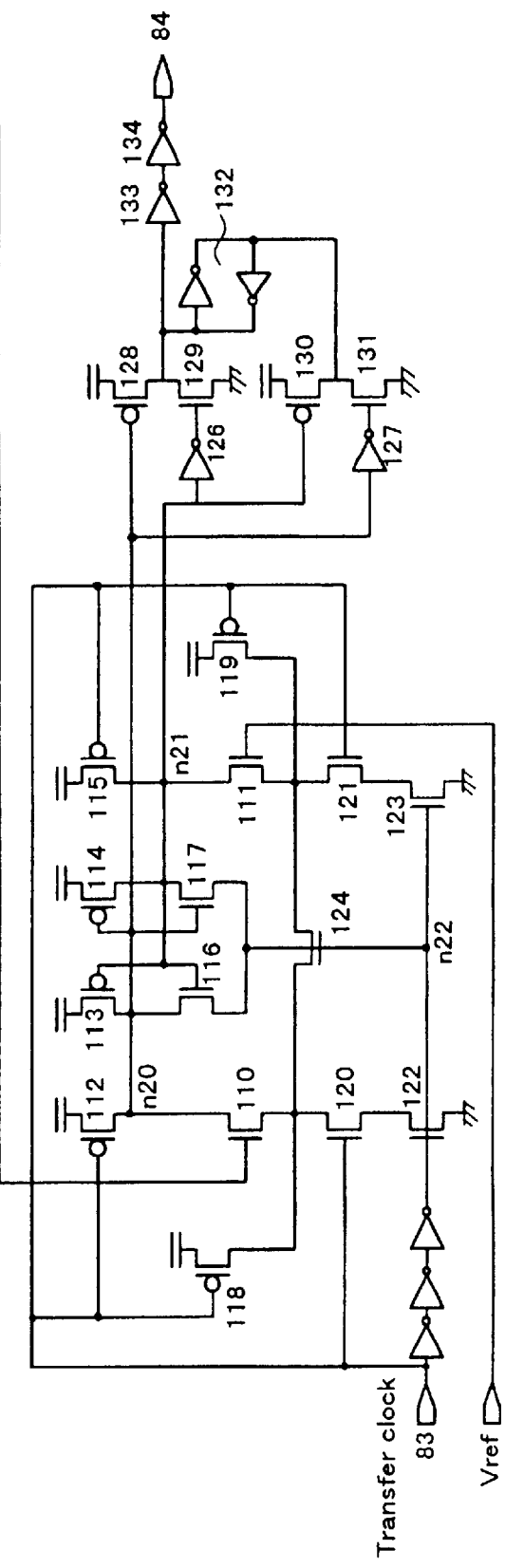

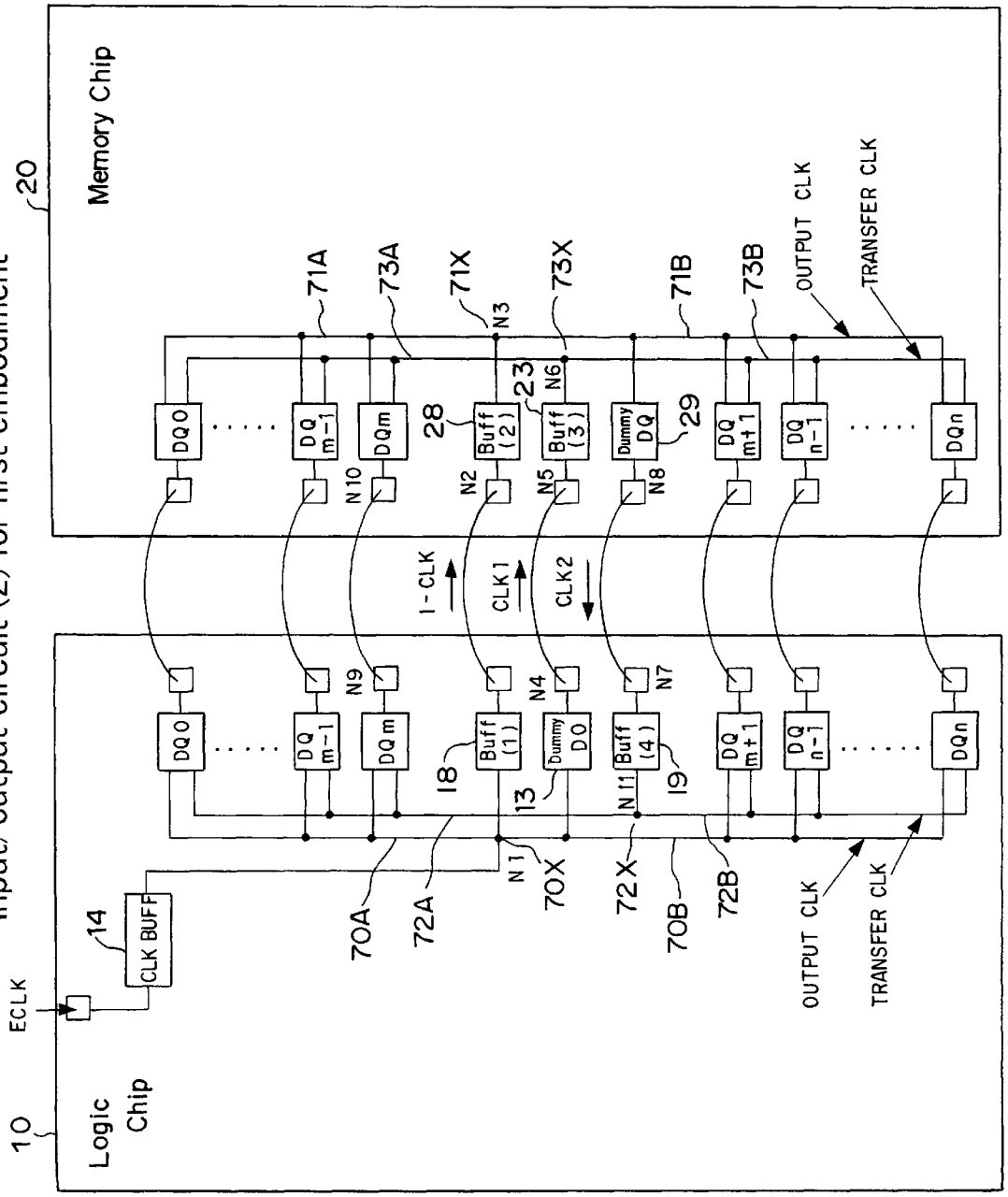
FIG. 10 Input/output circuit (2) for first embodiment

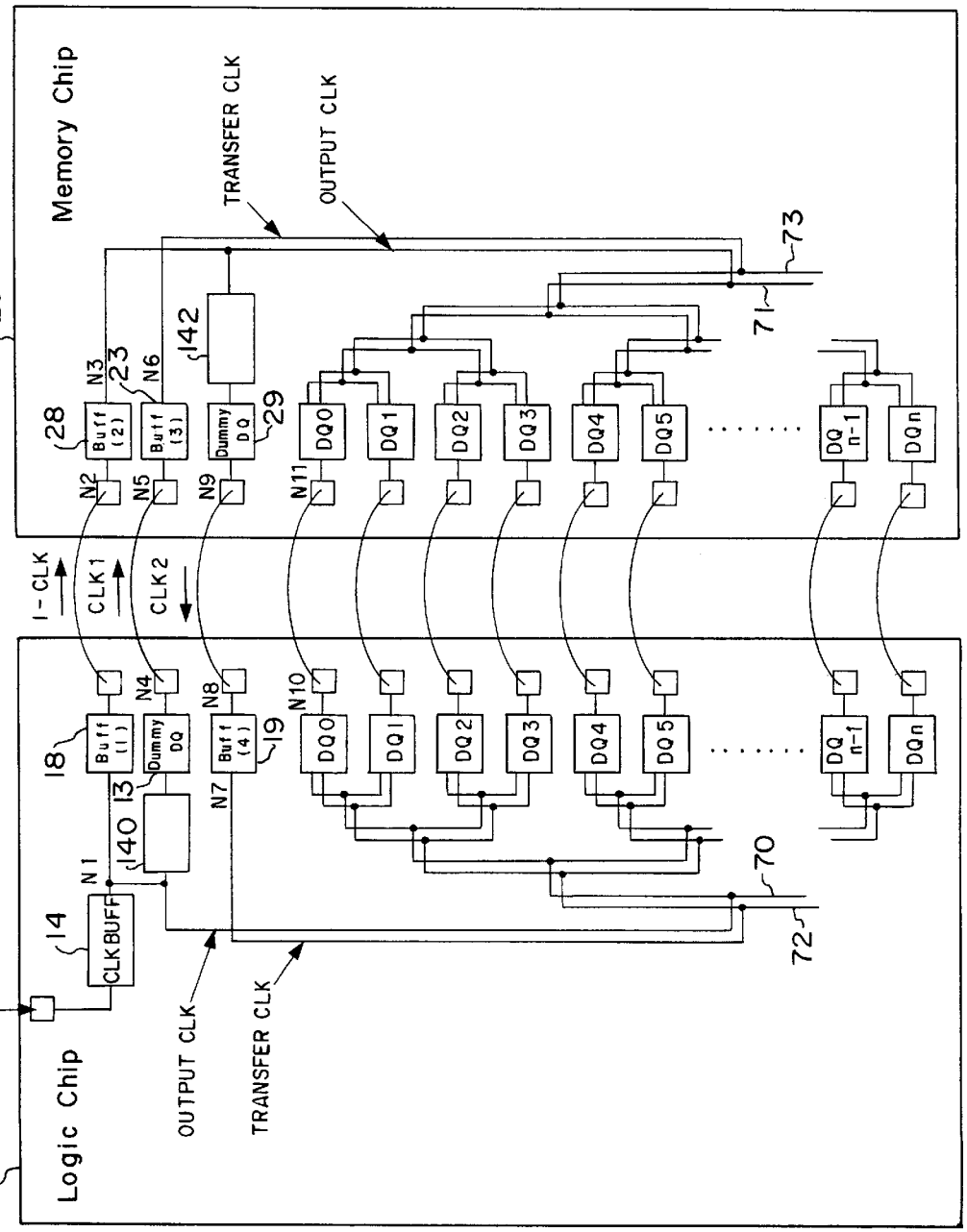
FIG. 11  Input/output circuit (3) for first embodiment

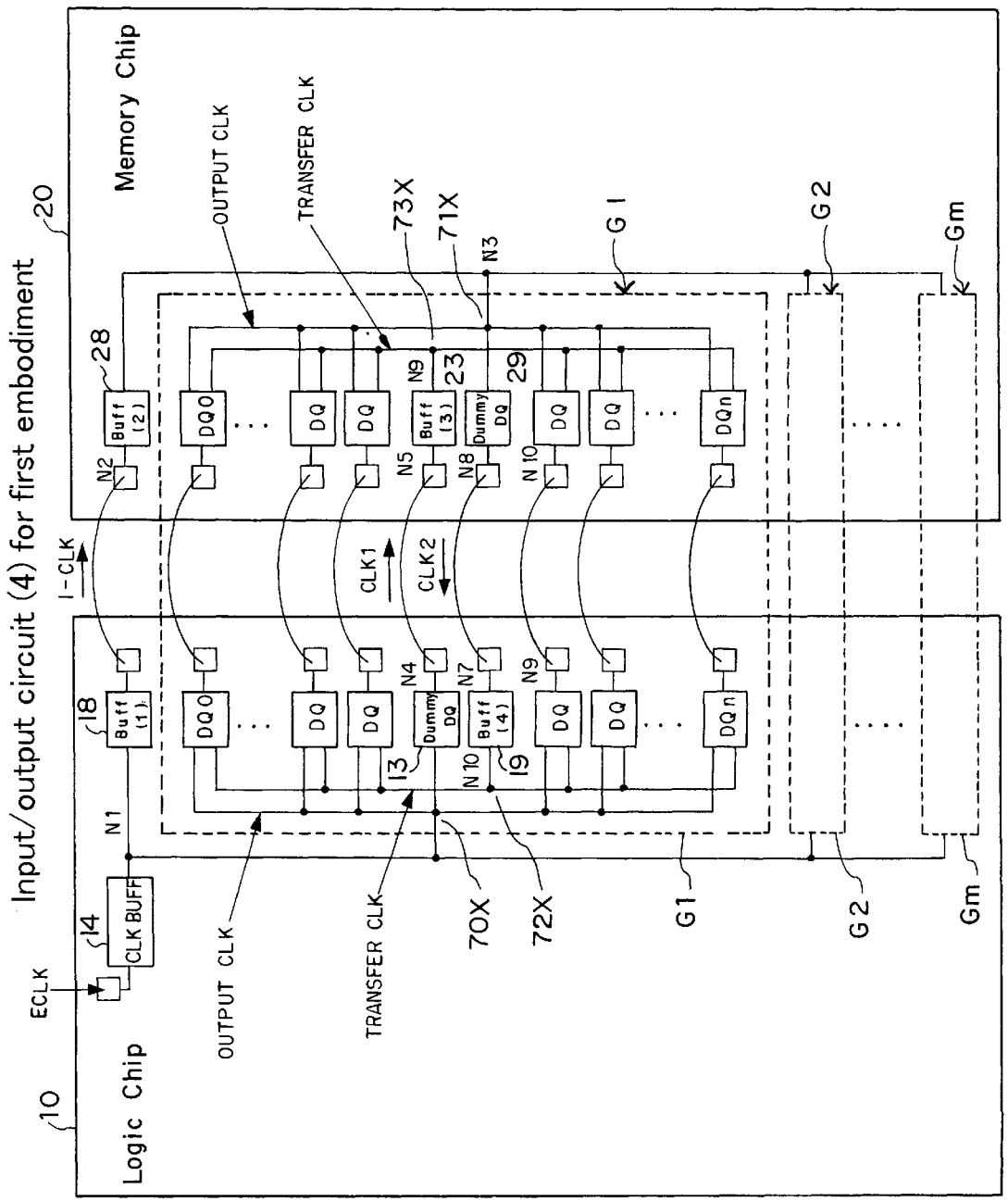
FIG. 12 Input/output circuit (4) for first embodiment

Second embodiment
FIG. 13A   Data 10 → 20 (WRITE)
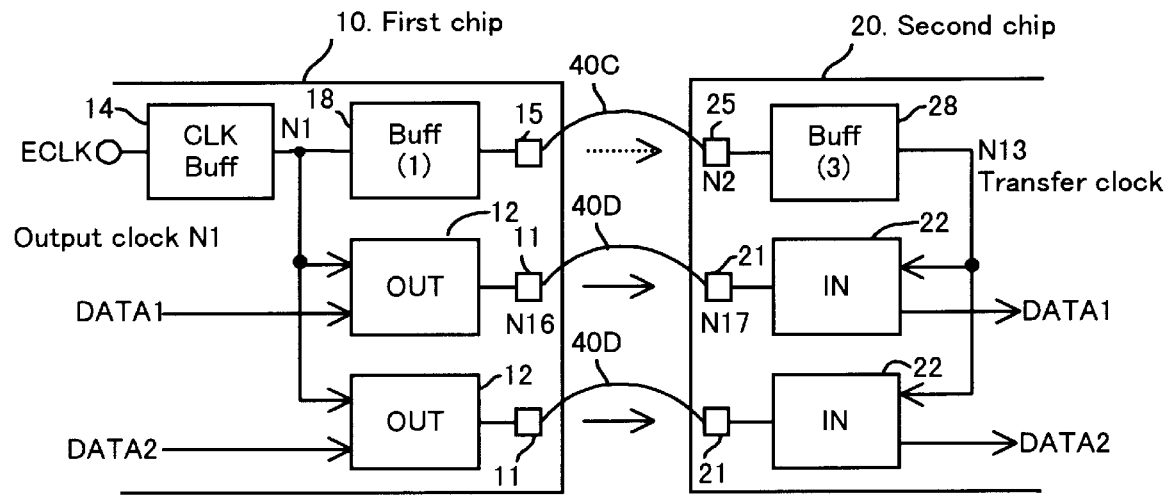
FIG. 13B   Data 10 ← 20 (READ)
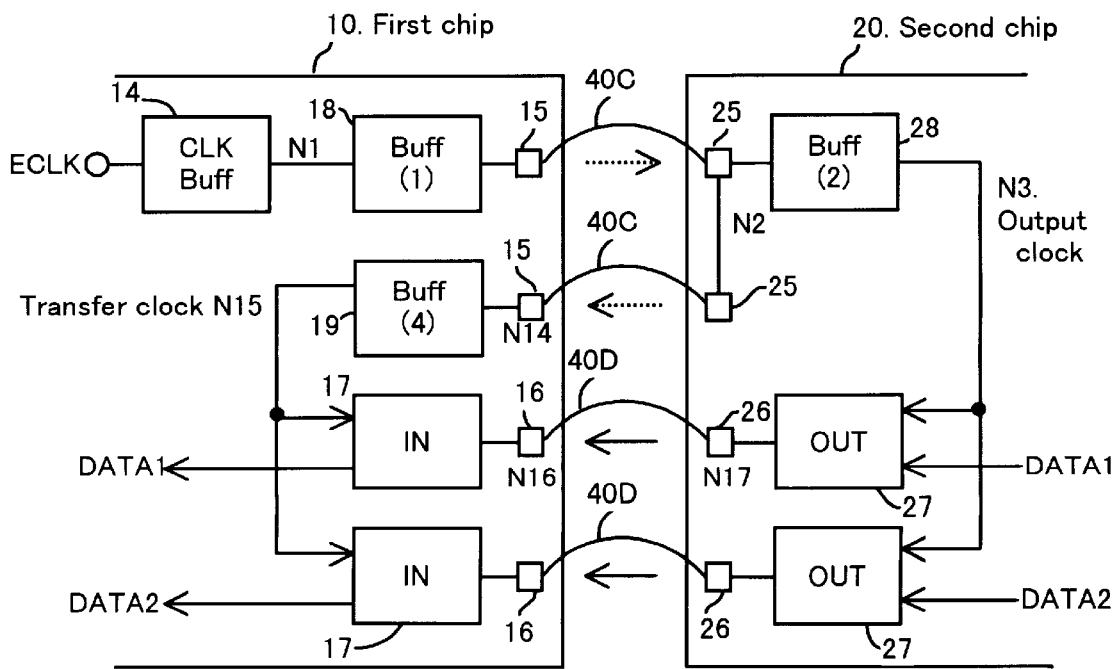

Timing chart for second embodiment

Third embodiment
FIG. 16A  Data 10 → 20 (WRITE)
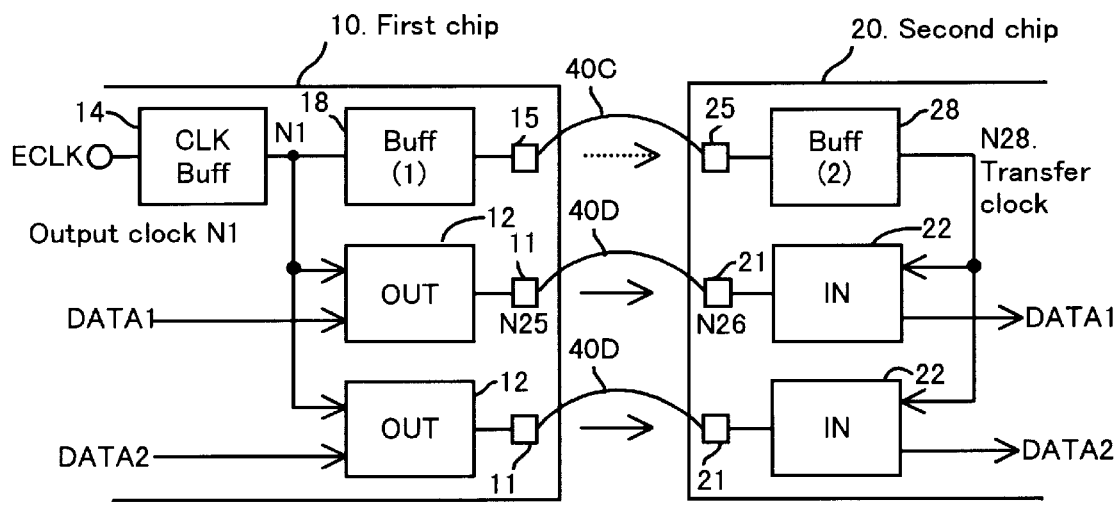
FIG. 16B  Data 10 ← 20 (READ)
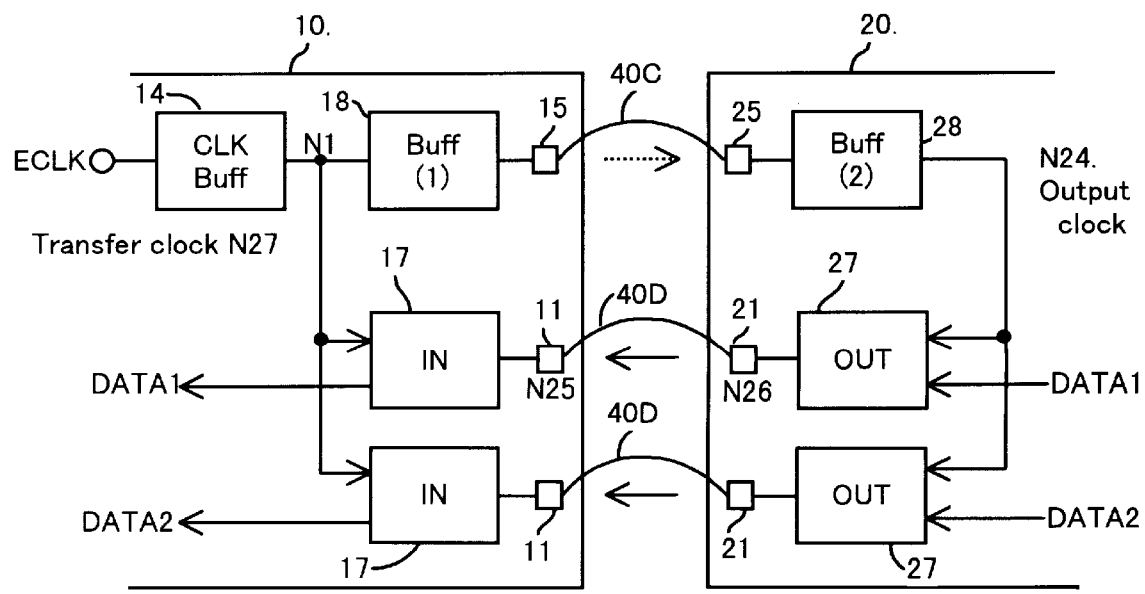

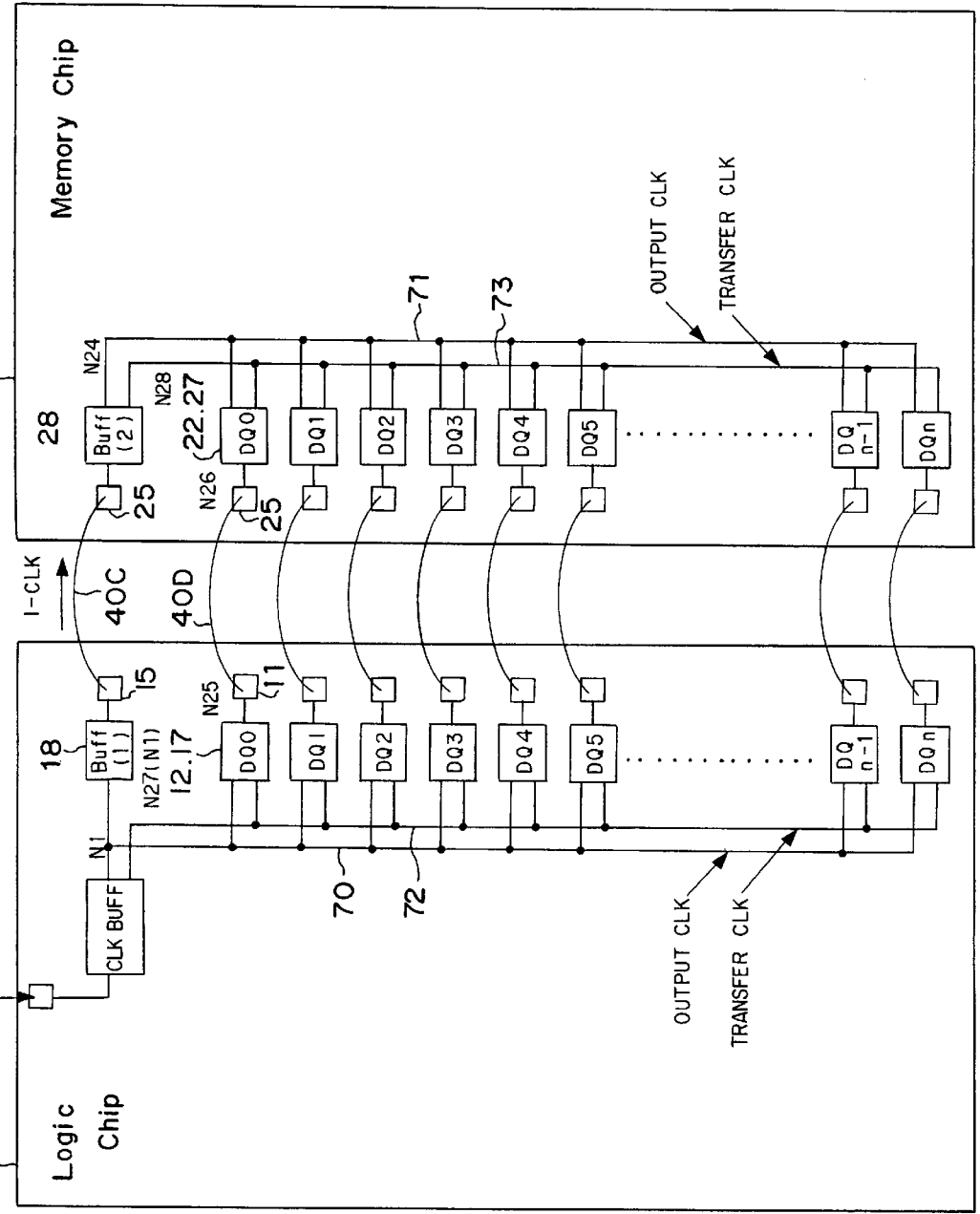
FIG. 17 Input/output circuit for third embodiment

Timing chart for third embodiment

FIG. 19 Input/output circuit (1) for fourth embodiment

Timing chart (1) for fourth embodiment

FIG. 21 Input/output circuit (2) for fourth embodiment

Timing chart (2) for fourth embodiment

Fifth embodiment

FIG. 24 Sixth embodiment

LSI DEVICE WITH MEMORY AND LOGICS MOUNTED THEREON

BACKGROUND OF THE INVENTION

1. Field of the Invention

The present invention relates to a multi-chip package on which a plurality of chips such as a memory device chip and a logic device chip are mounted, and, more particularly, to a novel structure which can implement fast transfer of data signals between both types of chips.

2. Description of the Related Art

A logic device, such as a microcontroller or a memory controller, and a memory device like a DRAM are connected together by a bus line, whereby a data signal like a stored data or an address is sent to the memory device from the logic device, and a data signal stored in the memory device is sent to the logic device.

FIG. 25 shows a conventional structure which has a logic device connected to a memory device. In FIG. 25, a logic device 10 and a memory device 20 are connected together by bus lines 5, so that a data signal is transferred at a high speed in synchronism with a clock. Recently, the speed of transfer of data signals between the logic device 10 and the memory device 20 is getting faster and faster. Increasing the data transfer rate requires an increase in the number of bus lines or an increase in the clock frequency for data transfer. The former scheme increases the bus-lines occupying area on the board on which both devices are mounted, thereby increasing the dissipation power for driving the bus lines. The latter scheme is inadequate because it suffers a limitation to the transfer performance of the bus lines themselves as well as the device speed itself.

FIG. 26 shows the structure of a system LSI which has a logic section 2 and a memory section 3 embedded in a single chip. This structure can permit an improvement on the speed of data transfer between the logic section 2 and the memory section 3. optimization of the logic section 2 and the memory section 3 however requires that both sections should be formed by separate processes, which together with the one-chip structure would increase the manufacturing cost.

Although designing a logic device and a memory device on a single chip is advantageous in improving the transfer speed, however since it increases the manufacturing cost, it is not practical. A promising method therefore is to construct a logic device and a memory device on separate chips and then to design those chips into a multi-chip structure.

But, any adequate means for accomplishing fast transfer of data signals between such two chips of the multi-chip structure has not been proposed so far. In particular, no structure which outputs a data signal from one chip in synchronism with a predetermined clock and allows the other chip to receive the data signal and transfer it inside has been proposed yet.

SUMMARY OF THE INVENTION

Accordingly, it is an object of this invention to provide an inexpensive multi-chip device which has substantially the same data transfer rate as a one-chip device.

It is another object of this invention to provide a multi-chip device capable of implementing fast data transfer between chips in synchronism with a clock.

It is a further object of this invention to provide a memory device which can receive external data signals at a high speed.

To achieve the above objects, according to a first aspect of this invention, there is provided an LSI device on which a first chip and a second chip to be connected by lead lines are mounted, and in which the first chip has an output circuit for outputting a data signal in response to an output clock, and a data output terminal connected to the output circuit, the second chip has an input circuit for receiving the data signal, output from the output circuit, in response to a transfer clock generated from the output clock and sent to the second chip via the lead line for clock, and a data input terminal connected to the input circuit, and the data output terminal in the first chip and the data input terminal in the second chip are arranged on opposing sides of both chips and are connected together via the lead line for data.

According to the first aspect of the invention, a data signal is output from the output circuit of the first chip and sent to the data input terminal in the second chip via the data lead line based on the output clock in first chip, which is sent to the second chip, and the input circuit in the second chip receives the data signal and transfers it inside in response to the transfer clock that has been generated from the output clock in the first chip. In synchronism with a single reference clock in the first chip, therefore, a data signal can be transferred to the second chip from the first chip at a high speed.

To achieve the above objects, according to a second aspect of this invention, there is provided an LSI device on which a first chip and a second chip to be connected by lead lines are mounted, and in which the first chip has an input circuit for inputting a data signal from the second chip in response to a transfer clock in the first chip, and a data input terminal connected to the input circuit, the second chip has an output circuit for outputting a data signal in the second chip to the input circuit in response to an output clock generated from the transfer clock and sent inside the second chip via the lead line for clock, and a data output terminal connected to the output circuit, and the data input terminal in the first chip and the data output terminal in the second chip are arranged on opposing sides of both chips and are connected together via the lead line for data.

According to the second aspect of the invention, a data signal is received at the data input terminal in the first chip and transferred inside based on the transfer clock in first chip, which is sent to the second chip, and a data signal is output from the output circuit in the second chip and sent to the data input terminal in the first chip via the data lead line in response to the output clock that has been generated from the transfer clock. In synchronism with a single reference clock in the first chip, therefore, fast transfer of a data signal to the first chip from the second chip can be implemented.

To achieve the aforementioned objects, according to a third aspect of this invention, each chip in the first and second aspects of the invention has a plurality of input circuits and a plurality of output circuits and their associated data input terminals and data output terminals are provided along their opposing sides. Also provided is a clock supply line which supplies the transfer clock or the output clock to the associated output circuits or input circuits at approximately the same timings.

This structure can ensure fast transfer of plurality of data signals between the first and second chips in synchronism with the reference clock in the first chip.

BRIEF DESCRIPTION OF THE DRAWINGS

FIGS. 6A and 6B are diagrams showing a first embodiment;

FIG. 7 is a diagram exemplifying a fast input/output circuit according to the first embodiment;

FIG. 9 is a diagram depicting a specific example of an input/output circuit DQ;

FIG. 10 is a diagram showing one modification of the fast input/output circuit according to the first embodiment;

FIG. 11 is a diagram showing another modification of the fast input/output circuit according to the first embodiment;

FIG. 12 is a diagram showing a further modification of the fast input/output circuit according to the first embodiment;

FIGS. 13A and 13B are diagrams illustrating a second embodiment;

FIGS. 16A and 16B are diagrams illustrating the structure of a third embodiment;

FIG. 17 is a diagram exemplifying a fast input/output circuit according to the third embodiment;

DETAILED DESCRIPTION OF THE PREFERRED EMBODIMENTS

Preferred embodiments of the present invention will now be described with reference to the accompanying drawings. The technical scope of the invention is, however, in no way restricted to those embodiments.

Figure 1:
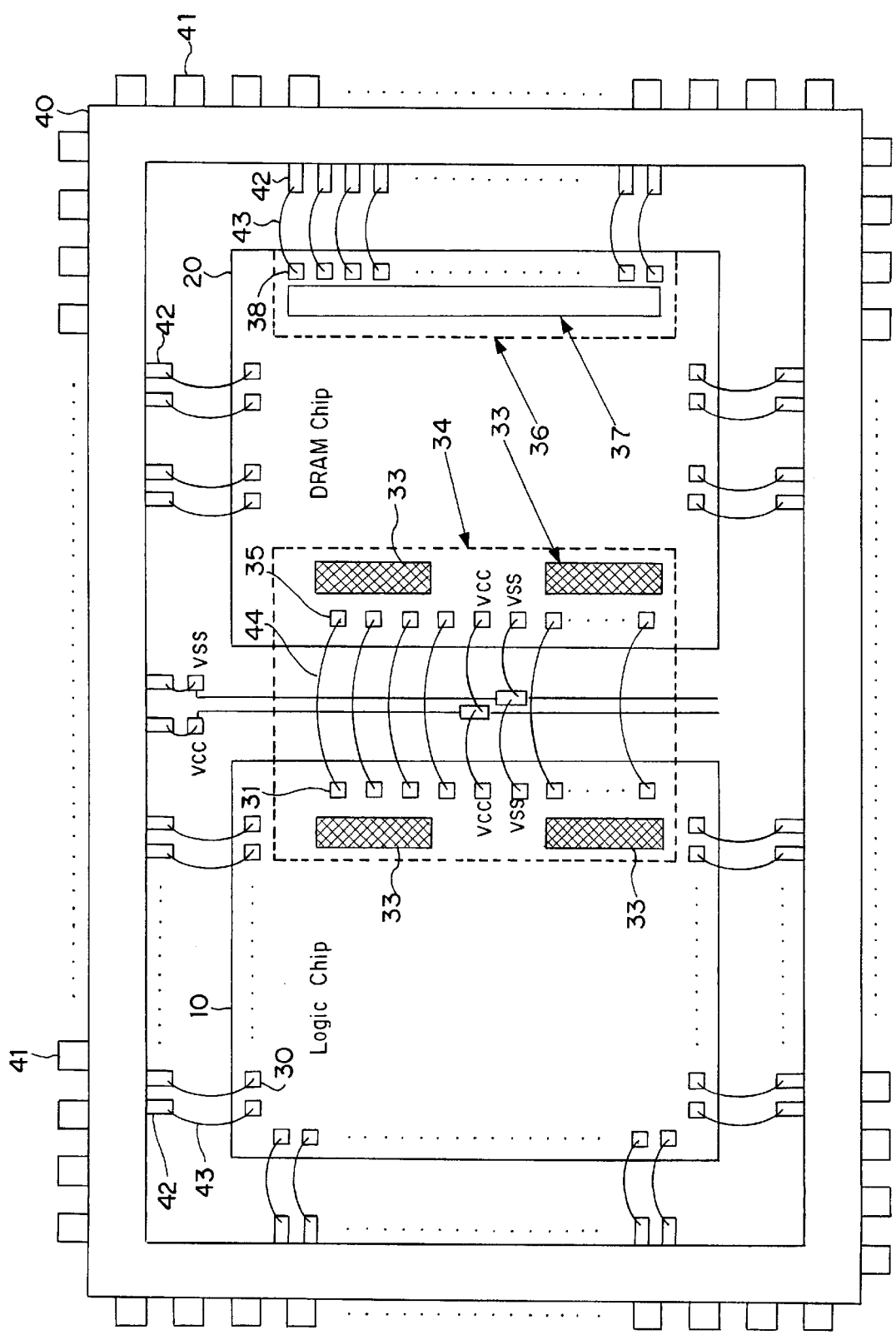
FIG. 1 is a diagram illustrating the structure of an MCP (Multi-Chip Package) according to this invention, which has a logic chip and a memory chip mounted therein.

FIG. 1 is a diagram illustrating the structure of an MCP (Multi-Chip Package) according to this invention, which has a logic chip and a memory chip mounted therein. The MCP shown in FIG. 1 has a logic chip 10 and a memory chip 20 mounted in a common package 40. In this example, the memory chip 20 is a DRAM chip, and the logic chip 10 is a memory controller. External terminals 30 provided in the logic chip 10 are connected to inner leads 42 in the package 40 via lead lines 43. Likewise, external leads 38 provided inside the memory chip 20 are connected to the inner leads 42 in the package 40 via lead lines 43.

The feature of this invention lies in that input/output terminals 31 and 35 are arranged at facing positions along the opposing sides of the logic chip 10 and the memory chip 20. The input/output terminals 31 are connected to the facing, respective input/output terminals 35 by lead lines 44 of gold or the like. Provided in the logic chip 10 and the memory chip 20 are fast input/output circuits 33 associated with the input/output terminals 31 and 35. Data signals are transferred via the input/output terminals 31 from the fast input/output terminal 33 in the logic chip 10 to the input/output terminals 35 in the memory chip 20 to be input to the fast input/output circuits 33 in the memory chip 20. Transfer of data signals from the memory chip 20 to the logic chip 10 is carried out in a similar manner. Therefore, the input/output circuits 33 and the input/output terminals 31 in the logic chip 10, the input/output circuits 33 and the input/output terminals 35 in the memory chip 20, and the lead lines 44 which connect both chips constitute a memory-logic input/output circuit 34.

As illustrated, power supplies VCC and VSS to supply power to both chips 10 and 20 are respectively connected to power supplies VCC and VSS which supply power to the package 40.

As shown in FIG. 1, the LSI device of this invention has two chips 10 and 20 mounted thereon, and implements data transfer between the chips via the lead lines 44 of gold or the like, connecting both chips together, not via bus lines provided on the board as in the prior art. The input/output circuits 33 provided inside the chips can drive the input/output terminals 31 and 35 and the lead lines 44 with low power consumption. What is more, connection through the lead lines 44 requires a smaller occupying area than the conventional connection through the bus lines. The individual chips 10 and 20 can be manufactured in their respective optimal fabrication processes, which can overcome the problem of an increased cost of the fabrication process associated with the conventional one-chip structure.

Figure 2:
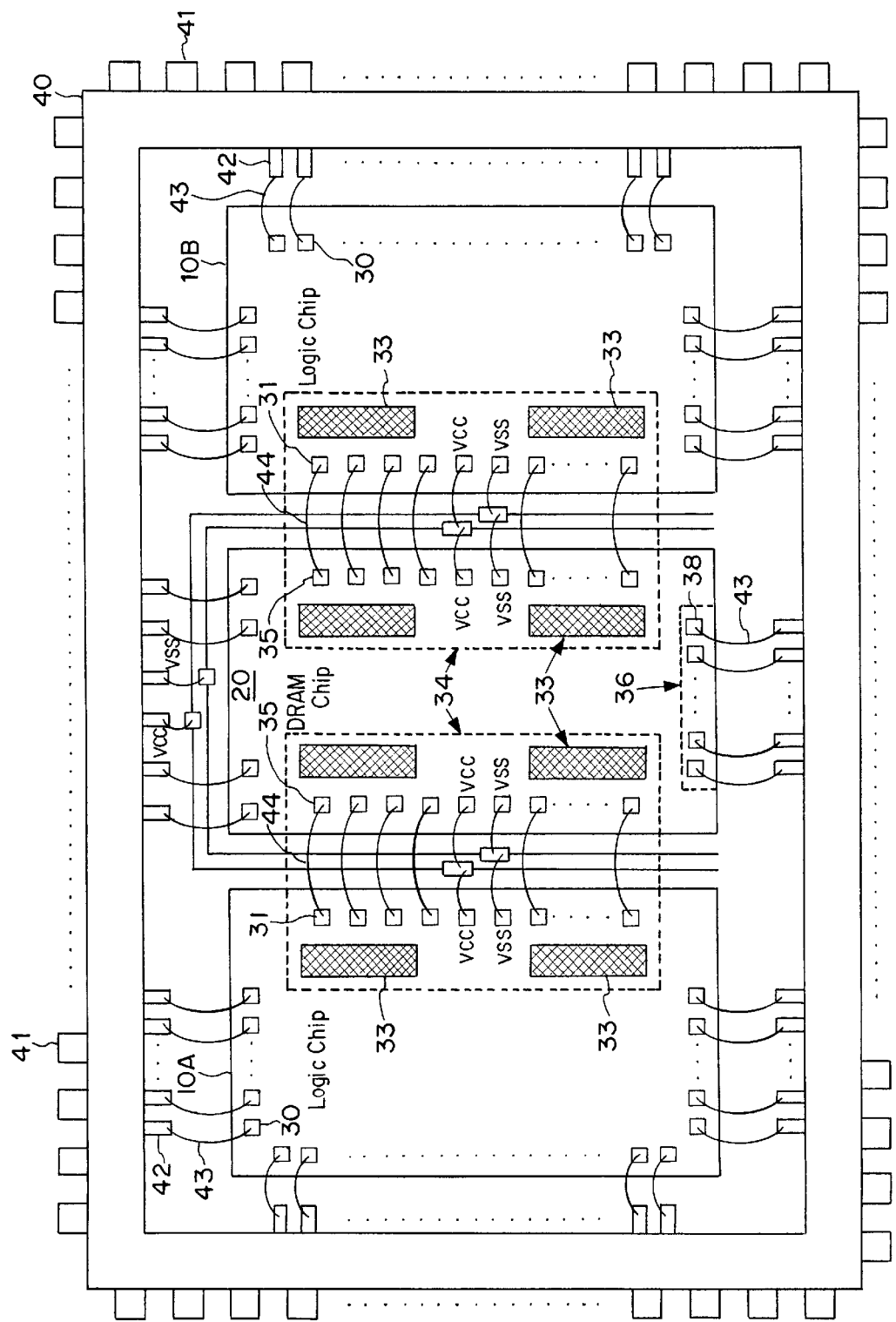
FIG. 2 is a diagram showing another structure of an MCP according to this invention, in which a logic chip and a memory chip are mounted.

FIG. 2 is a diagram showing another structure of an MCP according to this invention, in which a logic chip and a memory chip are mounted. FIG. 2 uses the same reference numerals as used in FIG. 1 for corresponding components. In the example of FIG. 2, logic chips 10A and 10B are provided on the respective sides of a single memory chip 20. Input/output terminals 35 and 31 are provided on the opposing sides of the memory chip 20 and the logic chip 10A and are connected together by lead lines 44. Likewise, input/output terminals 35 and 31 are provided on the opposing sides of the memory chip 20 and the logic chip 1OB and are connected together by lead lines 44. Each structure is the same as the one illustrated in FIG. 1. The memory chip 20 is connected to an external memory device outside the package 40 by input/output terminals 38 and an input/output circuit 36 for an external memory device. That is, the memory chip 20 performs fast data exchange with two logic chips IOA and 1OB and performs exchange of data signals with the external memory device (not shown), provided outside the package 40, through the input/output circuit 36.

In FIG. 2, the arrangement of the memory chip 20 and the logic chips 10A, lOB may be reversed. In other words, two memory chips 20 may be arranged on the respective sides of a single logic chip located in middle. The aforementioned input/output terminals 31 and 35 and input/output circuits 33 are provided on the opposing sides of each memory chip 20 and the logic chip to ensure fast data transfer between both chips. As will be apparent from the following description of several embodiments, this invention is not limited to an LSI device with a logic chip and a memory chip, but may be adapted to any LSI device which implements fast data transfer between two different chips.

Figure 3:
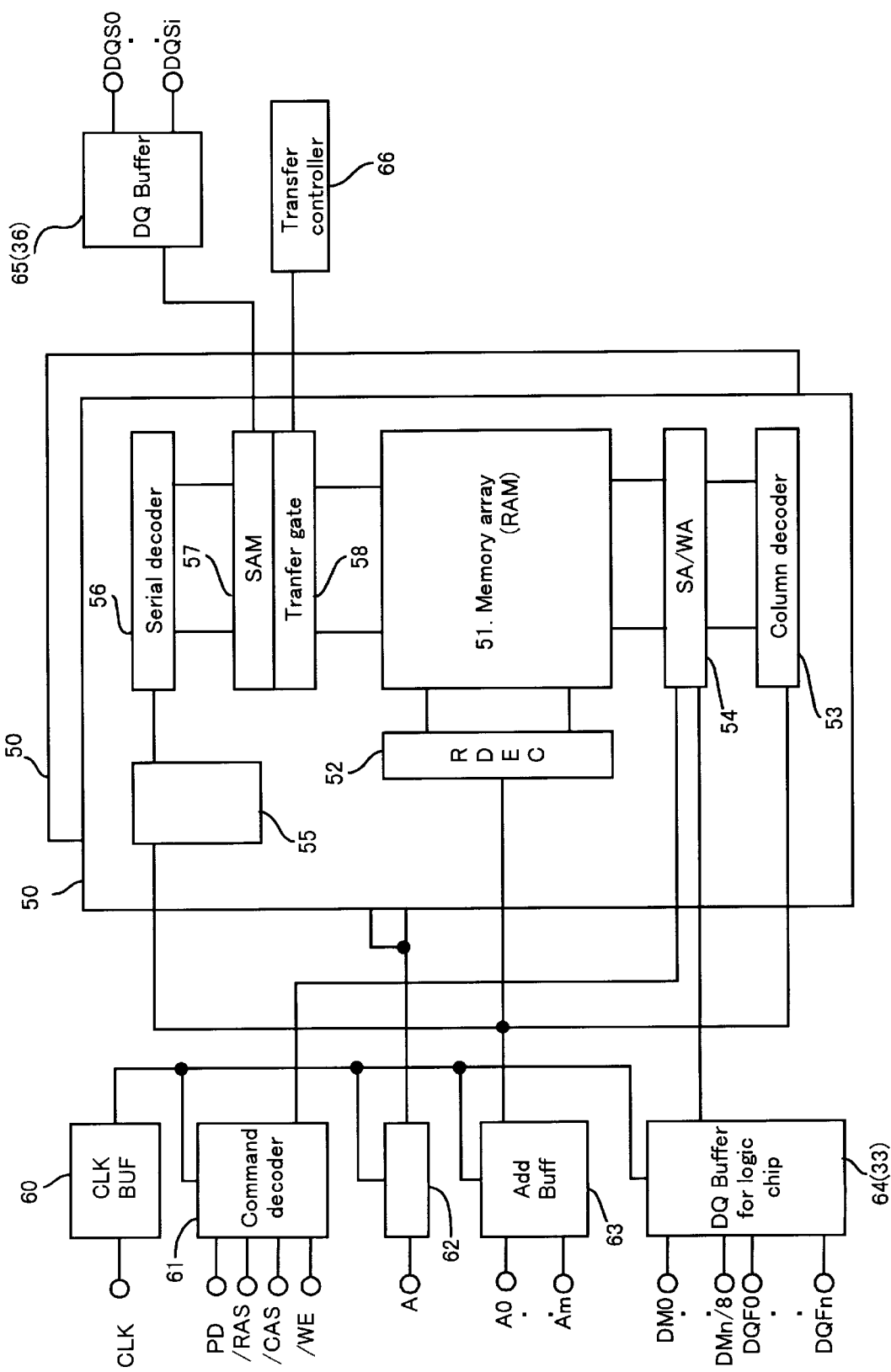
FIG. 3 is a diagram exemplifying the structure of a synchronous DRAM as one example of a memory chip.

FIG. 3 is a diagram exemplifying the structure of a synchronous DRAM as one example of a memory chip. The synchronous DRAM shown in FIG. 3 has two memory banks 50. Each memory bank 50 includes a memory cell array 51, a row decoder 52, a column decoder 53, a sense amplifier/write amplifier 54, a serial address counter 55, a serial decoder 56, a serial access memory 57 and a transfer gate 58. Provided as peripheral circuits are a clock buffer 60 to which a clock CLK is input, a command decoder 61 to which various kinds of commands are input, a bank selector 62 to which a bank select signal A is input, an address buffer 63 to which addresses A0 to Am are input, and a DQ buffer 64 for a logic chip. This DQ buffer 64 corresponds to the fast input/output circuit 33 shown in FIGS. 1 and 2. Data mask signals DM0 to DMn/8 and data signals DQF0 to DQFn are input to the DQ buffer 64. The address buffer 63 receives the address signals A0–Am in response to a clock which is generated by the clock buffer 60. Thus, the address buffer 63, when serving as an input circuit, corresponds to the fast input/output circuit 33 shown in FIGS. 1 and 2.

The synchronous DRAM shown in FIG. 3 has a DQ buffer 65 for an external memory device and a transfer control circuit 66 as peripheral circuits. This DQ buffer 65 corresponds to the input/output circuit 36 for an external memory device shown in FIG. 2. Data from the external memory device, which may be a hard disk, CDROM or the like, is temporarily stored in the serial access memory 57 via the DQ buffer 65. Thereafter, the data is transferred to the memory cell array 51 by the transfer gate 58 and stored there. The stored data is output to a logic chip, provided along the synchronous DRAM, via the DQ buffer 64. To transfer data to the external memory device from the logic chip side, on the other hand, a data signal from the logic chip is input to the DQ buffer 64 and temporarily stored in the memory chip 51. Thereafter, the data signal is temporarily stored in the serial access memory 57 via the transfer gate 58, and is sent via the DQ buffer 65 to the external memory device located outside the package 40.

Figure 4:
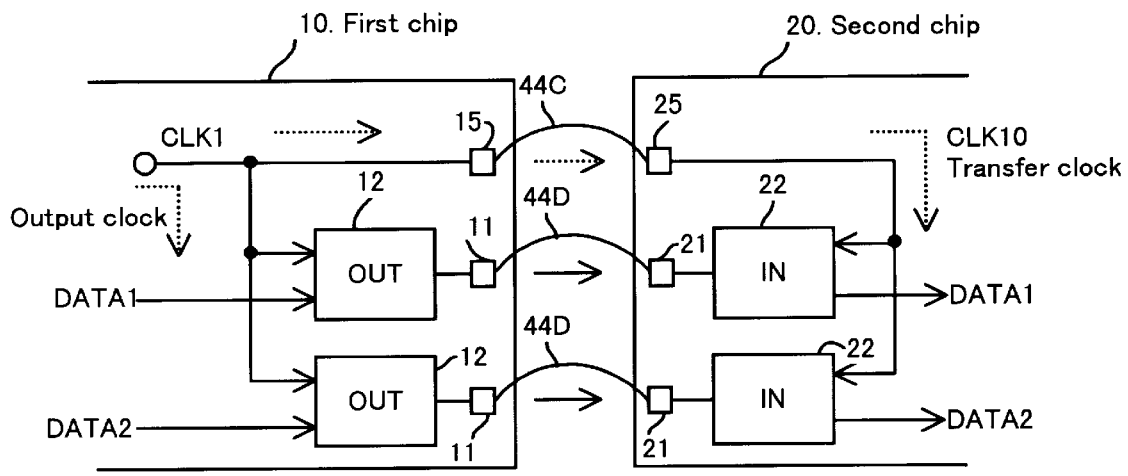
FIG. 4 is a principle diagram of this invention.

FIG. 4 is a principle diagram of this invention. FIG. 4 shows input/output circuits in a case where data signals are transferred from a first chip 10 to a second chip 20. Provided inside the first chip 10 are a clock output terminal 15, and a plurality of output circuits 12 and data output terminals 11. In response to an output clock CLK1 in the first chip, the output circuits 12 output internal data signals DATA1 and DATA2 to the respective output terminals 11. Provided inside the second chip 20 are a clock input terminal 25, and a plurality of data input terminals 21 and input circuits 22. The output terminals 11 and 15 of the first chip 10 are connected to the respective input terminals 21 and 25 of the second chip 20 by lead lines 44D and 44C, respectively.

The output clock CLK1 in the first chip 10 is transferred to the clock input terminal 25 of the second chip 20 via the clock output terminal 15 and the clock lead line 44C. The clock transferred to the clock input terminal 25 is supplied as a transfer clock CLK10 to the input circuits 22. The data signals DATA1 and DATA2 in the first chip 10 are transferred from the output circuits 12 to the input terminals 21 on the second chip 20 via the data output terminals 11 and the data lead lines 44D. The input circuits 22 fetch the data signals and transfer them inside the second chip 20 in response to the transfer clock CLK10.

According to this invention, as described above, based on the output clock CLK1, data signals are sent out from the output circuits 12 of the first chip 10 and are fetched by the input circuits 22 of the second chip 20 to be transferred inside. The output clock CLK1 and the transfer clock CLK10 are synchronous with each other with a predetermined phase difference, so that fast transfer of data signals from the first chip 10 to the second chip 20 can be carried out in synchronism with the clock.

Figure 5:
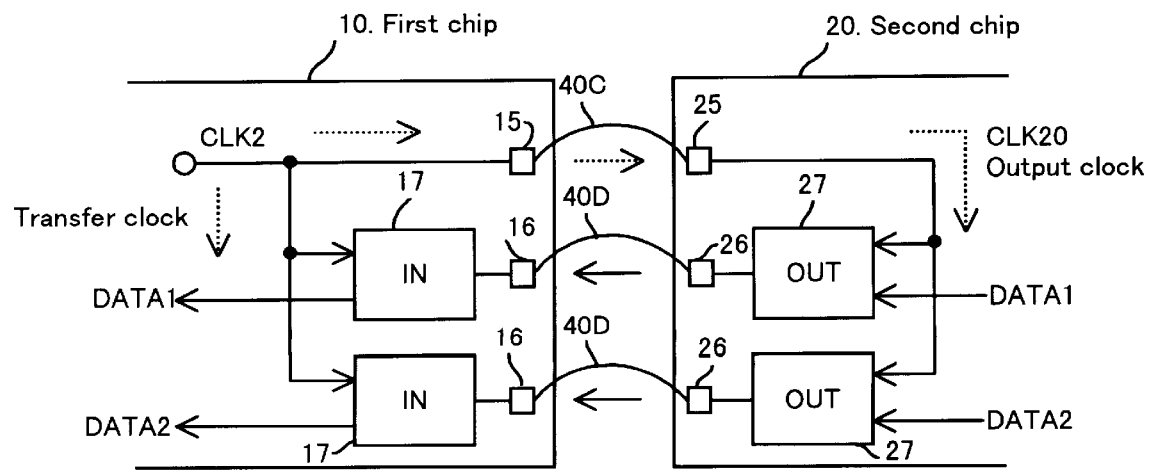
FIG. 5 is a principle diagram of a second invention.

FIG. 5 is a principle diagram of a second invention. FIG. 5 exemplifies input/output circuits in a case where data DATA1 and DATA2 in the second chip 20 are transferred to the first chip 10 based on a clock CLK2 in the first chip 10. Referring to FIG. 5, a clock output terminal 15, and a plurality of input circuits 17 and data input terminals 16 are provided in the first chip 10. Provided in the second chip 20 are a clock input terminal 25, and a plurality of output circuits 27 and data output terminals 26. The input terminals 16 and the output terminal 15 of the first chip 10 are respectively connected to the output terminals 26 and the input terminal 25 of the second chip 20 by the respective lead lines 40D and 40C.

In FIG. 5, the transfer clock CLK2 in the first chip 10 is transferred to the second chip 20 via the output terminal 15, the lead line 40C and the input terminal 25, and is supplied as an output clock CLK20 to the output circuits 27. Data in the second chip 20 are fetched to the output circuits 27 in response to the output clock CLK20 and are output from the data output terminals 26. In the first chip 10, each input circuit 17 fetches the data signal, sent to the data input terminal 16, and transfers it inside the first chip 10 in response to the transfer clock CLK2.

As apparent from the above, data in the second chip 20 are transferred to the first chip at a high speed based on the transfer clock CLK2 in the first chip 10.

FIG. 6 is a diagram showing a first embodiment. FIG. 6A shows a structure when data signals are transferred to the second chip 20 from the first chip 10. FIG. 6B shows a structure when data signals are transferred to the first chip 10 from the second chip 20. In FIG. 6A, a clock buffer 14 to which an external clock ECLK is input, and a dummy output circuit 13, which delays an output clock, generated by the clock buffer 14, by about the same amount as each output circuit 12, are provided in the first chip 10. A clock input terminal 25, which is connected via a clock lead line 40C to a clock output terminal 15, and a clock buffer 23, which is connected to the clock input terminal 25 and outputs a transfer clock N6, are provided in the second chip 20.

In FIG. 6A, the output circuits 12 output the data DATA1 and DATA2 in the first chip 10 in response to the output clock N1. At the same time, the output clock N1 is output by the dummy output circuit 13 which has about the same delay characteristic as that of the output circuits 12. Therefore, the output clock N1 and data signals are transferred to the input terminals 25 and 21 in the second chip 20 at substantially the same timings. In response to the transfer clock N6 generated by the clock buffer 23, the input circuits 22 fetch the data signals and transfer them inside the second chip 20. As will be described later, therefore, the input circuits 22 fetch transferred data signals and transfer them inside the second chip 20 in a setup time substantially the same as the delay time of the clock buffer 23.

In FIG. 6B, a first output buffer 18 which sends a reference clock N1 to the second chip 20, and a first input buffer 19 which receives a transfer clock returned from the second chip 20 are provided in the first chip 10. Provided in the second chip 20 are a second input buffer 28 which receives a transfer clock sent from the first output buffer 18, and a dummy output circuit 29 which has about the same delay characteristic as that of the output circuits 27.

With this structure, the reference clock N1 is transferred to the second chip 20 via the output buffer 18, the lead line 40C and the input buffer 28, and is supplied as an output clock N3 to the output circuits 27. The clock that has been input to the input buffer 28 is returned to the first chip 10 by the dummy output circuit 29, input to the input buffer 19 and supplied to the input circuits 17 as a transfer clock N11 in the first chip 10. Therefore, the data DATA1 and DATA2 in the second chip 20 are sent out from the input circuits 27 in response to the output clock N3. The output clock N3 is sent to the first chip 10 by the dummy output circuit 29 at the same timing as the data signals. Accordingly, the input circuits 17 fetch the transferred data signals and transfer them inside the first chip 10 with the delay time of the input buffer 19 as the setup time.

FIG. 7 is a diagram exemplifying a fast input/output circuit according to the first embodiment. FIG. 7 uses the same reference numerals as used in FIG. 6 for corresponding components. In FIG. 7, the first chip 10 is a logic chip, and the input circuits 17 and the output circuits 12 are shown as input/output circuits DQ0 to DQn. The second chip 20 is a memory chip, and the input circuits 22 and the output circuits 27 are shown as input/output circuits DQ0 to DQn. In FIG. 7, the clocks or data signals which pass through the individual input terminals and output terminals are denoted by "N2," "N4," "N5," and "N7" to "N10." Lines for data signals DATA are omitted in FIG. 7.

As shown in FIG. 7, each chip 10 or 20 is provided with a plurality of input/output circuits DQ0–DQn, and input/output terminals 11 and 16 and input/output terminals 21 and 26, which are connected to the respective input/output circuits DQ0–DQn, are arranged at opposing positions along the opposite sides of the two chips. The associated input/output terminals are connected together by respective data lead lines 40D.

An output clock line 70 for supplying the output clock N1 to the individual input/output circuits runs along the input/output circuits DQ in the logic chip 10, and an output clock line 71 for the output clock N3 likewise runs along the input/output circuits DQ in the memory chip 20. Further, a transfer clock line 72 for supplying the transfer clock N11 to the individual input/output circuits runs along the input/output circuits DQ in the logic chip 10, and a transfer clock line 73 for the transfer clock N6 likewise runs along the input/output circuits DQ in the memory chip 20. This layout of the clock lines allows clocks to be supplied to the input/output circuits DQ0 with a desired phase relationship, and likewise allows clocks to be supplied to the lowermost input/output circuits DQn of both chips with a desired phase relationship.

Figure 8:
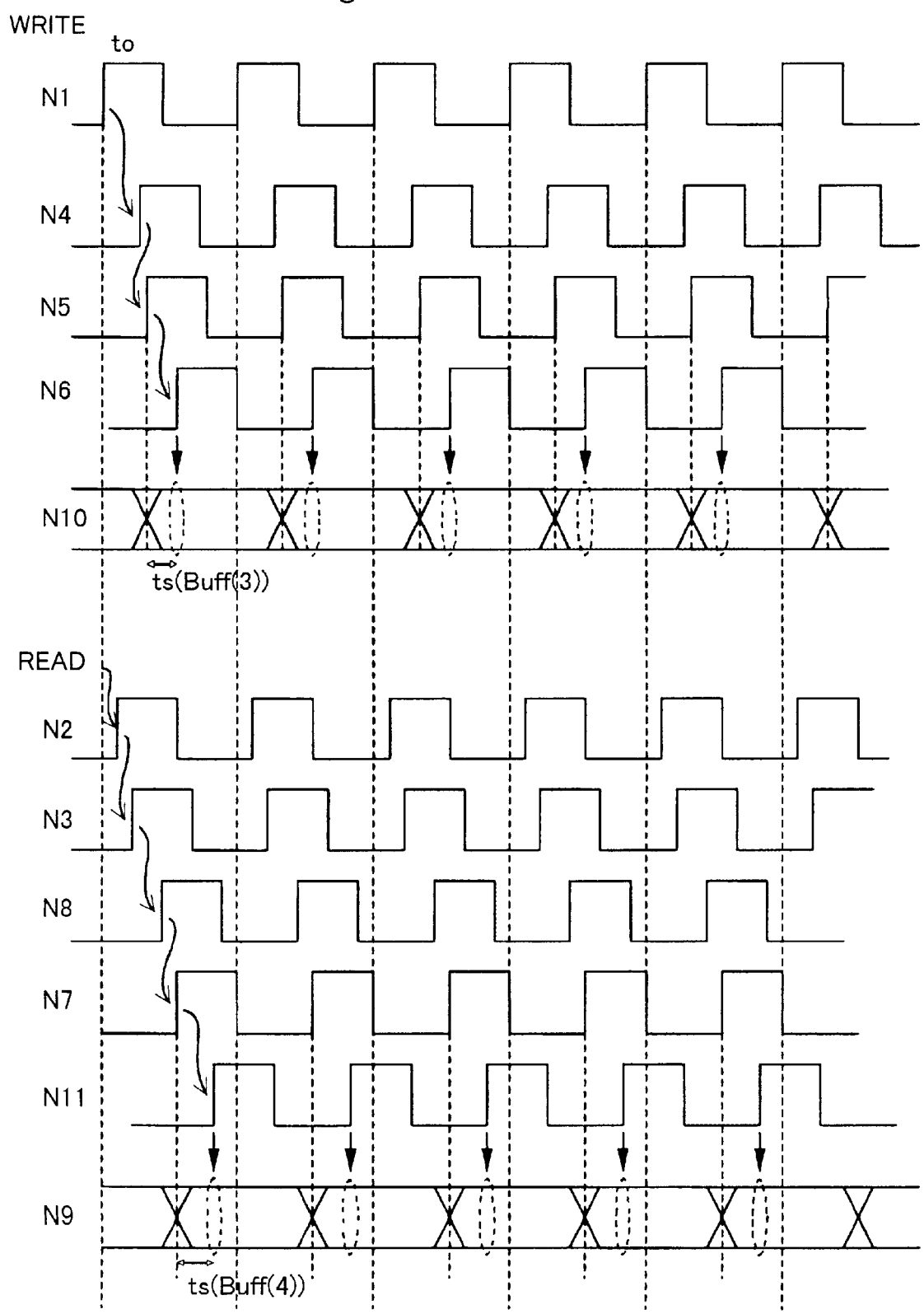
FIG. 8 is a timing chart for the first embodiment.

FIG. 8 is a timing chart for the first embodiment. The upper half of FIG. 8 shows a timing chart for data transfer to the memory chip 20 from the logic chip 10 (write operation), and the lower half of FIG. 8 shows a timing chart for data transfer to the logic chip 10 from the memory chip 20 (read operation). FIG. 8 shows the timings for the signals at the individual nodes N1–N11 in FIGS. 6A, 6B and 7.

A description will now be given of a case where data signals are transferred to the memory chip 20 from the logic chip 10 (WRITE). The clock N1 which rises at time t0 is delayed by the dummy output circuit 13 and becomes the clock N4 at the output terminal 15, which is delayed by the delay time of the dummy output circuit 13. The clock signal N5 at the input terminal 25 in the memory chip 20 is delayed from the clock N4 by the delay time of the clock lead line 40C. The transfer signal N6 or the output of the clock input buffer 23 in the memory chip 20 is delayed from the clock N5 by the delay time of the input buffer 23. Data in the logic chip 10 is sent from the output circuits 12 in response to the output clock N1 or the reference clock, and the data signal N10 at each data input terminal 21 in the memory chip 20 has substantially the same timing as the clock signal N5. In the memory chip 20, each input circuit 22 fetches the data signal NIO in response to the transfer clock N6 and transfers it inside the chip 20. As apparent from FIG. 8, therefore, each input circuit 22 in the memory chip 20 fetches the data signal N10 after the setup time ts equivalent to the delay time of the clock input buffer 23, after the data signal N10 transferred to the associated input terminal 21 has been supplied to that input circuit 22.

The following will discuss a case where data in the memory chip 20 is read out to the logic chip 10 (READ). The reference clock N1, which rises at time t0, is transferred to the input terminal 25 in the memory chip 20 via the clock output buffer 18 and the lead line 40C. The clock N2 at the input terminal 25 therefore has a timing delayed by the delay times of the output buffer 18 and the lead line 40C. The output clock N3 which is generated from the input buffer 28 has a timing delayed from the clock N2 by the delay time of the input buffer 28. The dummy output circuit 29 sends the output clock N3 to the output terminal. The clock N8 at the output terminal is therefore delayed by the delay time of the dummy output circuit 29. The clock N7 at the clock input terminal in the logic chip 10 is delayed from the clock N8 by the delay time of the lead line 40C. The transfer clock N11, which is generated by the clock input buffer 19, is delayed from the clock N7 by the delay time of the input buffer 19. Data in the memory chip 20 is sent out by each output circuit 27 via output terminal 26, and the data signal N9 arrives at each data input terminal 16 in the logic chip 10 at approximately the same timing as the clock N7. The data signal N9 is fetched in the associated input circuit 17 and transferred inside the logic chip 10 in response to the transfer clock N11 after the setup time ts equivalent to the delay time of the clock input buffer 19.

FIG. 9 is a diagram depicting a specific example of the input/output circuit DQ. The input/output circuit DQ comprises an output circuit 76 and an input circuit 78. The output circuit 76 fetches a data signal 80 at the L edge (falling edge) of an output clock 81, and sends it to an input/output terminal 82 at the H edge (rising edge) of the output clock 81. The input circuit 78 fetches the data signal, which has been supplied to the input/output terminal 82, at the H edge of a transfer clock 83 and sends it out to an output terminal 84.

In the output circuit 76, the output data 80 is inverted by a NOR gate 90 and a NAND gate 91, and transfer gates 92 and 93 are conductive at the L edge of the output clock 81 where the clock 81 changes its level from an H level to an L level. This causes the inverted output data to be latched in latch circuits 94 and 95. In response to the H edge of the output clock 81 where the clock 81 changes its level from an L level to an H level, transfer gates 96 and 97 are conductive, permitting the latched data to be latched in respective latch circuits 98 and 99. In accordance with those latched data signals, one of a P type transistor 102 and an N type transistor 103, which constitutes an output CMOS circuit, is conductive, causing the output data 80 to be sent to the input/output terminal 82.

In the input circuit 78, when the transfer clock 83 has an L level, P type transistors 112, 113, 114, 115, 118 and 119 are conductive, resetting nodes n20 and n21 to H levels. The transfer data signal which is to be input to the input/output terminal 82 is supplied to the gate of an N type transistor 110, and a reference voltage VREF is supplied to the gate of an associated transistor 111. Transistors 120 to 123 are conductive in response to the H edge of the transfer clock 83 where the clock 83 changes its level from an L level to an H level, and the transistor 110 or 111 is conduntive in accordance with the data signal that is supplied to the gate of the transistor 110, causing either the node n20 or the node n21 to change its level to an L level. After a delay of three stages of inverters from the H edge of the transfer clock 83 where the clock 83 changes its level from the L level to the H level, the node n22 is pulled down to an L level. This enables a CMOS latch circuit 113, 114, 116 and 117, thus amplifying signals at the nodes n20 and n21. A CMOS circuit 128 and 129 and a CMOS circuit 130 and 131 are driven in accordance with the amplified signals at the node n20 and n21. An inverted signal which is generated as a consequence is latched by a latch circuit 132, and is sent out from the output terminal 84 via inverters 133 and 134.

FIG. 10 is a diagram showing a modification of the fast input/output circuit according to the first embodiment. FIG. 10 uses the same reference numerals as used in FIG. 7 for corresponding components. In FIG. 10, the output buffer 18 for the clock N1, the input buffer 28, the dummy output circuit 13, the input buffer 23, the dummy output circuit 29 and the input buffer 29 have the same structures of those in FIG. 7. In FIG. 10, those clock buffers and dummy output circuits are arranged in the middle portions of the input/output buffers DQ0 to DQn. For the input/output buffers DQ0–DQm located at the upper portions of both chips 10 and 20, an output clock line 70A for supplying the output clock N1 as the reference clock and a transfer clock line 72A for supplying the transfer clock N11 are provided. For the input/output buffers DQm+1 to DQn located at the lower portions of the logic chip 10, an output clock line 70B for outputting the output clock N1 and a transfer clock line 72B for supplying the transfer clock N11 are arranged. Accordingly, supply nodes 70X and 72X to which the clocks N1 and N11 are respectively supplied are arranged nearly at the center of the input/output buffers DQ0–DQn, so that deviation from the timings at which the clocks are supplied to the input/output circuits DQ0–DQn is reduced to a half as compared with the case of FIG. 7. Likewise, a supply node 73X to which the transfer clock N6 is supplied and a supply node 71X to which the output clock N3 is supplied are located between the upper and lower clock supply lines 71A and 71B and 73A and 73B in the memory chip 20. Consequently, a variation in the timings of the transfer clock N6 and output clock N3, which are to be supplied to the input/output terminals DQ0–DQn is suppressed to a half as compared with the case of FIG. 7.

FIG. 11 is a diagram showing another modification of the fast input/output circuit according to the first embodiment. In the example shown in FIG. 11, clock supply lines 70 and 72 are arranged in a tree shape so that the timings of the clocks to be supplied to the input/output circuits DQ0–DQn become substantially equal to one another. So are clock supply lines 71 and 73. As a result, the output clock and transfer clock are supplied to the individual input/output circuits DQ0–DQn at substantially the same timings. In accordance with the tree-like arrangement of the clock supply lines, dummy equivalent-length lines 140 and 142 whose lengths or delay times are equivalent to the lengths or the delay times of those clock supply lines are provided at the preceding stage of the dummy output circuits 13 and 29, respectively. The provision of the dummy equivalent-length lines 140 and 142 makes the timing for transfer of a data signal substantially coincide with the timing for transfer of a clock signal.

FIG. 12 is a diagram showing a further modification of the fast input/output circuit according to the first embodiment. In the input/output circuit exemplified in FIG. 12, the input/output circuits DQ, the dummy output circuit 13, the clock input buffer 19, the dummy output circuit 29 and the clock input buffer 23 are divided into a plurality of groups G1 to Gm, and the clock output buffer 18 and input buffer 28, common to the groups G1–Gm, are respectively provided on the chips 10 and 20. The Layout shape of the clock supply lines in each group is the same as the one shown in FIG. 10, and clock supply nodes 70X and 72X and 73X and 71X are located at the center portions. Such grouping can reduce the number of the input/output circuits DQ in each group even when each of the chips 10 and 20 has multiple input/output circuits DQ, and can minimize deviation of the timings of the clocks that are supplied to the input/output circuits in each group.

Though unillustrated, the layout shape of the clock supply lines in each group as shown in FIG. 12 may be modified to the tree-like shape as shown in FIG. 11. In this case, the lengths of the clock supply lines of the tree-like shape in each group can be made shorter.

FIG. 13 is a diagram illustrating a second embodiment. FIG. 13A shows a structure for a case where data signals are transferred to the second chip 20 from the first chip 10. In FIG. 13A, an external clock ECLK is supplied to the clock buffer 14 where an output clock N1 to be a reference clock is generated. The output clock N1 in the first chip 10 becomes a transfer clock N13 in the second chip 20 after passing the clock output buffer 18, the clock lead line 40C and the clock input buffer 28. In response to the output clock N1 in the first chip 10, the output circuits 12 transfer data signals DATA1 and DATA2 to the second chip 20. In response to the transfer clock N13 generated in the second chip 20, the input circuits 22 fetch the data signals transferred to the input terminals 21 and transfer them inside.

In the example of FIG. 13A, the output clock N1 or the reference clock in the first chip 10 is transferred inside the second chip 20 via the buffers 18 and 28 with small delay times and becomes the transfer clock N13. The second embodiment differs in this point from the first embodiment illustrated in FIG. 6. As the delay time of each output circuit 12 in the first chip 10, which operates in response to the output clock N1, is greater than those of the buffers 18 and 28, each input circuit 22 in the second chip 20 fetches a data signal N17 of the previous phase and transfers it inside the second chip 20 in response to the transfer clock N13 before the data signal arrives at the associated input terminal 21 in the second chip 20. The detailed operation will be explained later with reference to a timing chart.

FIG. 13B shows a structure for a case where data signals are transferred to the first chip 10 from the second chip 20. In this case, the reference clock N1 is transferred to the second chip 20 via the clock output buffer 18, clock lead line 40C and clock input buffer 28 and becomes the output clock N3. A transfer clock N15 in the first chip 10 is generated as the reference clock N1 is transferred via the buffer 18, two lead lines 40C and input buffer 19. That is, the transfer clock N15 is generated as the reference clock N1 is temporarily transferred to the second chip 20 and is then returned from the second chip 20. In the second chip 20, the output circuits 27 transfer data signals DATA1 and DATA2 to the first chip 10 in response to the output clock N3. In the first chip 10, the input circuits 17 fetch the data signals arrived at the input terminals 16 and transfer them inside the chip 10 in response to the transfer clock N15. As in the case of FIG. 13A, since the delay time of each output circuit 27 is greater than those of the buffers 18, 19 and 28, the input circuits 17 fetch data signals of the previous phase and transfer them inside the first chip 10 in response to the transfer clock N15. After that, the data signals output from the output circuits 27 reach the associated input terminals 16 in response to the output clock N3. The detailed operation will also be discussed later with reference to a timing chart.

Figure 14:
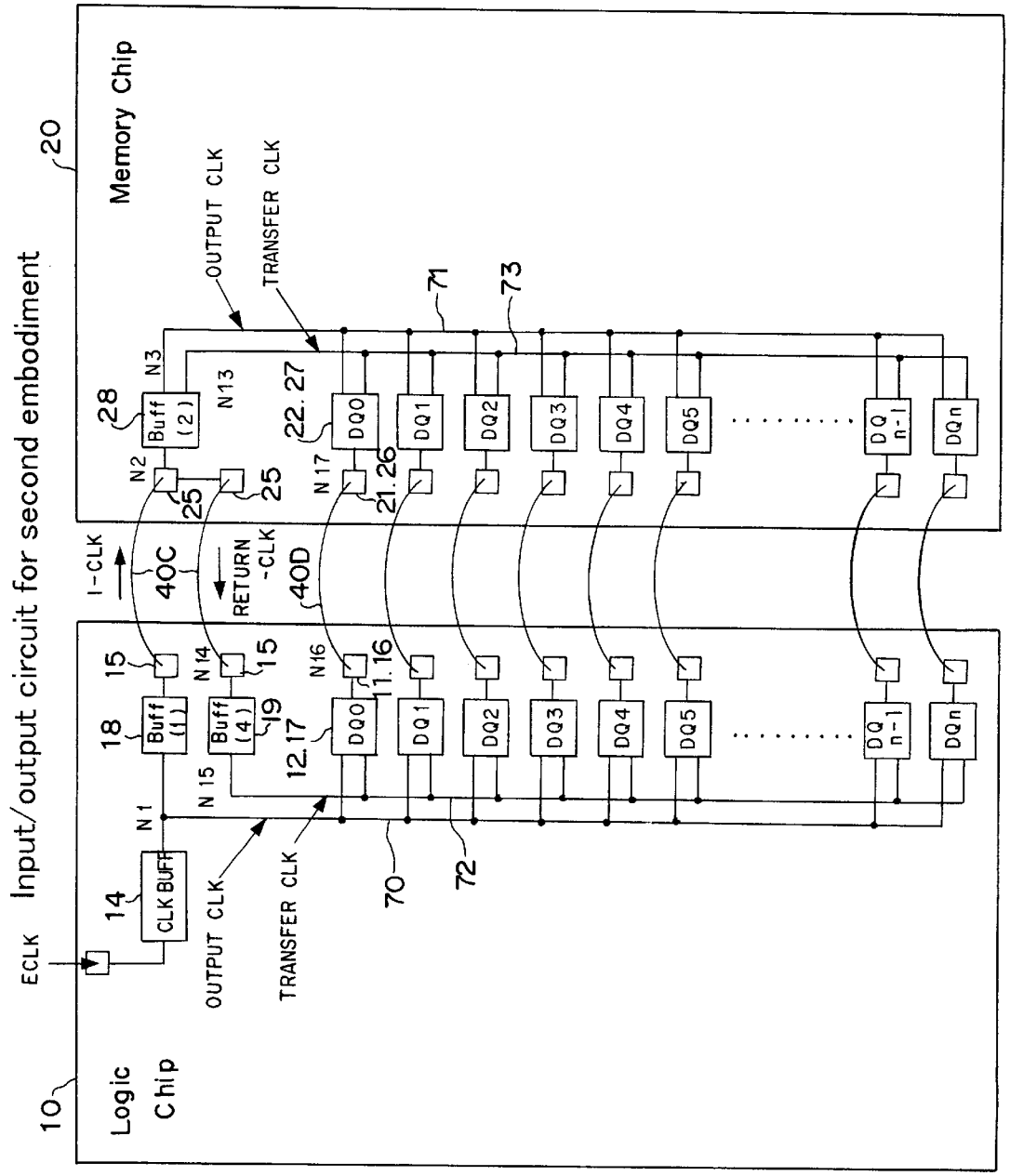
FIG. 14 is a diagram exemplifying a fast input/output circuit according to the second embodiment.

FIG. 14 is a diagram exemplifying a fast input/output circuit according to the second embodiment. FIG. 14 shows the input circuits and output circuits in FIG. 13 as input/output circuits DQ0–DQn. FIG. 14 uses the same reference numerals as used in FIG. 13 for corresponding components. For the operational explanation, clocks and data signals at the individual input/output terminals 15, 25, 11, 16, 21 and 26 are denoted by "N2," "N14," "N16" and "N17." In the circuit example shown in FIG. 14, as in the circuit example of the first embodiment shown in FIG. 7, output clock lines 70 and 71 for supplying the output clocks N1 and N3 and transfer clock lines 72 and 73 for supplying the transfer clocks N15 and N13 are arranged along a plurality of input/output circuits DQ0–DQn. The arrangement in FIG. 14 allows the output clocks N1 and N3 and the transfer clocks N15 and N13 to be supplied to the associated input/output circuits DQ in the logic chip 10 or the first chip and the memory chip 20 or the second chip with substantially the same timing relation.

Figure 15:
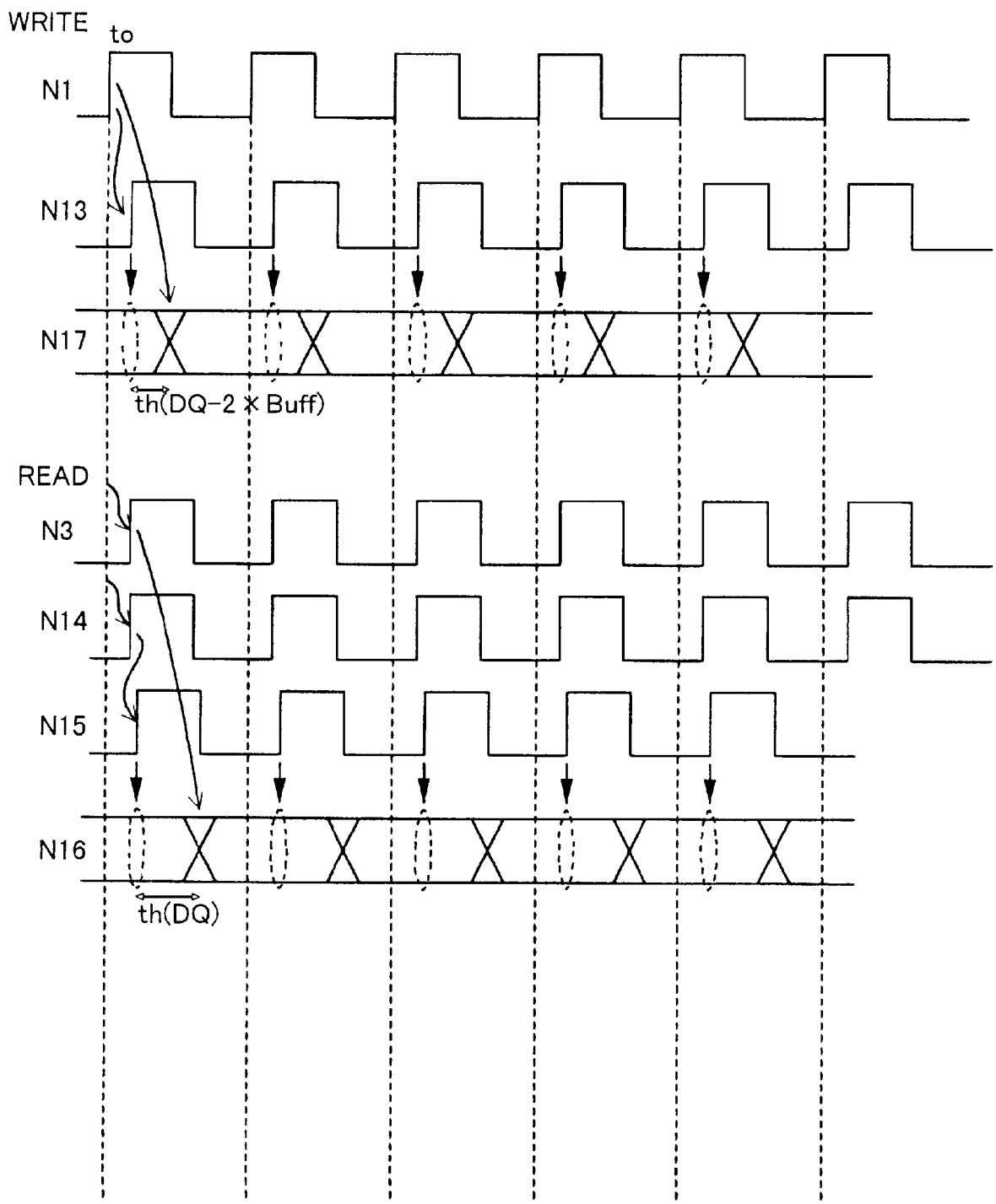
FIG. 15 is a timing chart for the second embodiment.

FIG. 15 is a timing chart for the second embodiment.

To begin with, a description will be given of the operation of transferring data signals to the second chip 20 from the first chip 10 (WRITE). The reference clock N1 in the first chip 10 rises at time t0. This reference clock N1 travels through the clock output buffer 18, the clock lead line 40C and the input buffer 28 and becomes the transfer clock N13 in the second chip 20. The transfer clock N13 is therefore delayed by the delay times of the buffers 18 and 28 and the lead line 40C. Each input circuit 22 in the second chip 20 fetches the data signal N17 and transfers it inside the chip 20 in response to the transfer clock N13. In the first chip 10, the output circuits 12 send the data signals DATA1 and DATA2 to the second chip 20 in response to the reference clock N1 as the output clock. Therefore, the data signal N17 which is supplied to each input terminal 21 in the second chip 20 is delayed from the output clock N1 by the delay times of the output circuit 12 and the lead line 40D. As mentioned above, because the delay time of the output circuit 12 is longer than those of the buffers 18 and 28, the input circuit 22 fetches the data signal N17 in response to the transfer clock N13 within a hold time th, which is the delay time (DQ) of the output circuit 12 minus the delay times (2×Buff) of the two buffers 18 and 28 as shown in FIG. 15.

A description will now be given of a case where data signals are transferred to the first chip 10 from the second chip 20 (read operation). First, the reference clock N1 in the first chip 10 is transferred via the lead line 40C to the second chip 20. The reference clock N1 is further returned to the first chip 10 from the second chip via the lead line 40C and the input buffer 19 and becomes the transfer clock N15. In response to this transfer clock N15, the input circuits 17 fetch the data signals supplied to the input terminals 16 and transfer them inside the first chip 10. Thus, the clock N14 is delayed from the reference clock Ni by the delay times of the output buffer 18, and two lead lines 40C. The transfer clock N15 is delayed from the clock N14 by the delay time of the input buffer 19.

The output clock N3 is delayed from the reference clock N1 by the delay times of the output buffer 18, the lead line 40C and the input buffer 28. Further, the clock N16 at each input terminal 16, which is supplied from the associated output circuit 27 in response to the output clock N3, is delayed from the output clock N3 by the delay times of the output circuit 27 and the lead line 40D. In this case too, the delay time of the output circuit 27 is greater than those of the buffer circuits 18, 19, 28, so that each input circuit 17 fetches a data signal of the previous phase in response to the transfer clock N15 before the data signal reaches the associated input terminal 16 in the first chip 10. That is, the hold time th becomes the delay time (DQ) of the output circuit 27 as shown in FIG. 15.

FIG. 16 is a diagram illustrating the structure of a third embodiment. FIG. 16A shows a structure for a case where data signals are transferred to the second chip 20 from the first chip 10. This structure is the same as that of the second embodiment shown in FIG. 13A except for the transfer clock in the second chip 20 being denoted by a reference numeral "N28" and data signals at the data input/output terminals 11 and 21 being denoted by reference numerals "N25" and "N26." The operation of this structure will not therefore be discussed.

FIG. 16B shows a structure for a case where data signals are transferred to the first chip 10 from the second chip 20. In this example, the reference clock N1 in the first chip 10 is used directly as a transfer clock N27 for the input circuit 17. The reference clock N1 is transferred to the second chip 20 via the output buffer 18, the lead line 40C and the input buffer 28, and is supplied to the output circuits 27 as an output clock N24. In response to the output clock N24, the output circuits 27 transfer data in the second chip 20 to the first chip 10.

FIG. 17 is a diagram exemplifying a fast input/output circuit according to the third embodiment. As in the first and second embodiments, a logic chip is used as the first chip 10 and a memory chip as the second chip 20 in the example of FIG. 17. The output circuits 12 and input circuits 17 in the first chip 10 are shown as input/output circuits DQ0–DQn. So are the input circuits 22 and the output circuits 27. Further, output clock lines 70 and 71 for supplying output clocks N1, N24 to those input/output circuits and transfer clock lines 72 and 73 for supplying transfer clocks N27, N28 to the input/output circuits are laid.

Figure 18:
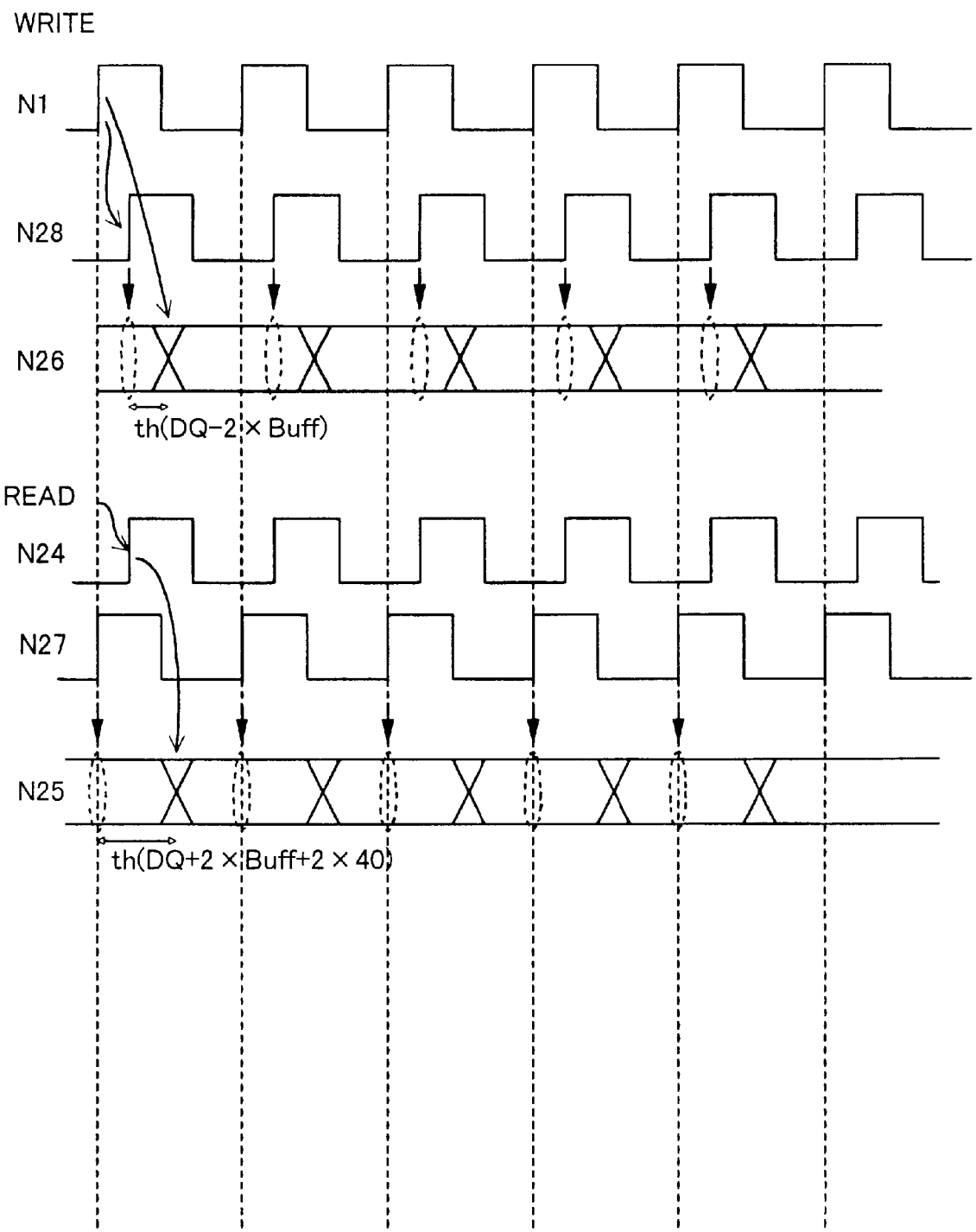
FIG. 18 is a timing chart for the third embodiment.

FIG. 18 is a timing chart for the third embodiment. As shown in FIG. 16A, the case of transferring data signals to the second chip 20 from the first chip 10 (write operation) is the same as that of the second embodiment. Thus, the hold time th in each input circuit 22 in the second chip 20 is the delay time (DQ) of the output circuit 12 in the first chip 10 minus the delay times (2×Buff) of the two buffers 18 and 28.

In the case where data signals are transferred to the first chip 10 from the second chip 20 (read operation), the output clock N24 is generated as the reference clock N1 passes through the two buffers 18 and 28 and the lead line 40C. The output clock N24 is therefore delayed from the reference clock N1 by the delay times of two buffers and the lead line. As each output circuit 27 transfers data to the first chip 10 in response to the output clock N24, the data signal N25 that is supplied to the associated input terminal 11 of the first chip 10 is delayed from the output clock N24 by the delay times of the output circuit 27 and the lead line 40D. Each input circuit 17 fetches the signal N25 at the input terminal 11 and transfers it inside the first chip 10 in response to the transfer clock N27 which has the same phase as the reference clock N1. Consequently, the hold time th in each input circuit 17 in the second chip 20 is equivalent to the sum of the delay time (DQ) of the output circuit 27, the delay times (2×Buff) of two buffers 18, 28 and the delay times of two lead lines 40C, 40D(40).

In this read operation, the hold time th of the third embodiment is longer than the hold time of the second embodiment shown in FIG. 15. In this respect, the second embodiment can implement an operation synchronous with a faster clock.

In the first to third embodiments, as described above, the reference clock N1 in the first chip 10 is transferred to the second chip 20 and is used as a trigger clock for the input/output operation in the second chip 20, and the clock which is generated from the reference clock N1 is used as a trigger clock for the input/output circuits in the first chip 10. This can allow the output timing and the input timing in transfer of data signals between both chips to be synchronized with the reference clock, thus ensuring fast transfer of data signals.

Figure 19:
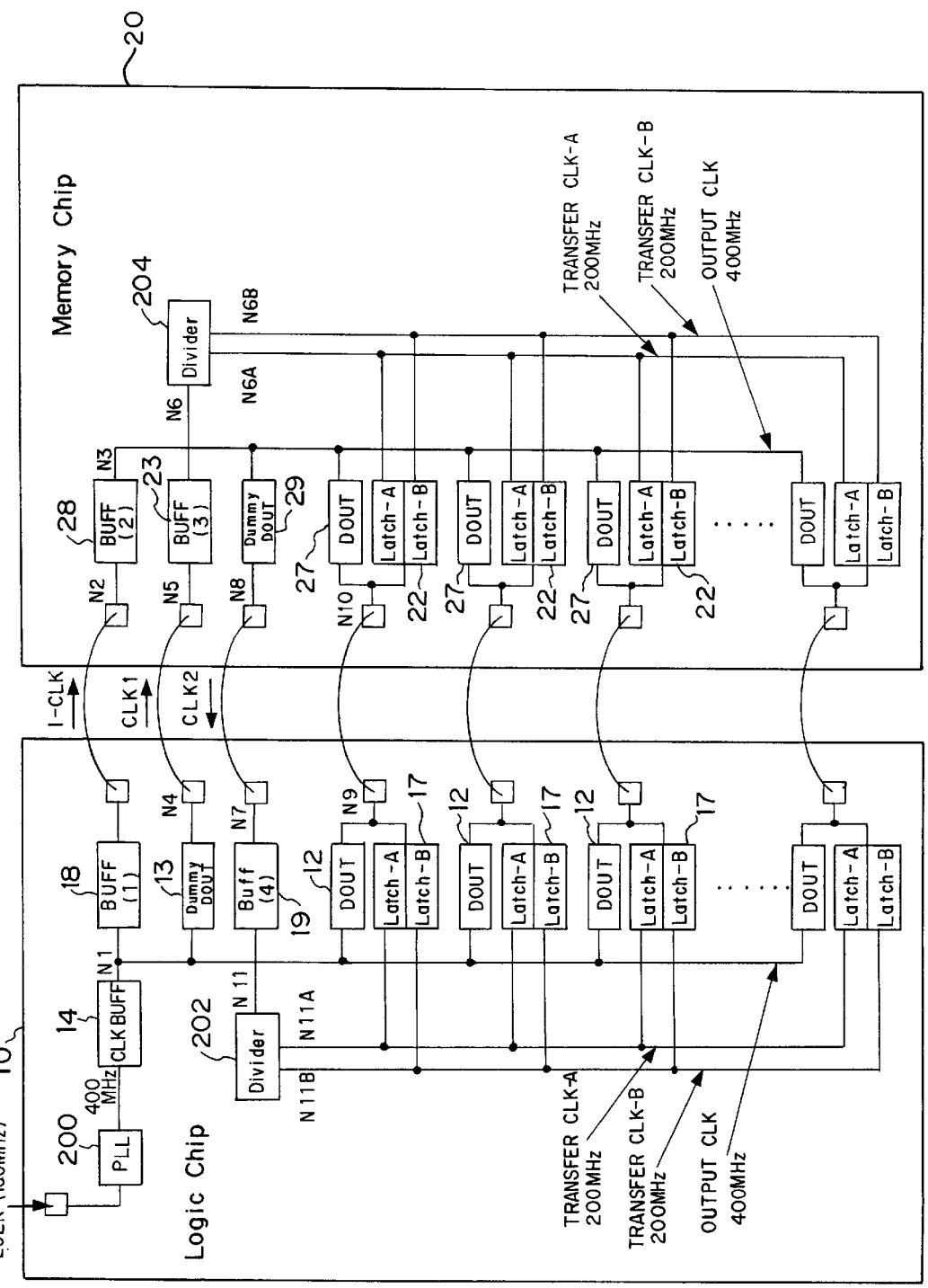
FIG. 19 is a diagram exemplifying a fast input/output circuit according to a fourth embodiment.

FIG. 19 is a diagram exemplifying a fast input/output circuit according to a fourth embodiment. In the fourth embodiment, with the external clock ECLK of 100 MHz, for example, the clock frequency is pulled up to four times or 400 MHz by a PLL circuit 200 provided in the first chip 10, and transfer of data signals between both chips is carried out in synchronism with this fast clock Ni.

In the fourth embodiment, each of the input circuits 17 and 22 has two sets of input circuits. That is, each of the input circuits 17 and 22 comprises two input circuits, a latch A and a latch B. For the trigger clocks to operate those two input circuits, clocks N6A and N6B which are generated by frequency-dividing the transfer clock N6 in the first embodiment by 2 in a frequency divider 204 are used. Likewise, the transfer clock N11 in the first chip 10 is frequency-divided by a frequency divider 202, yielding two transfer clocks N11A and N11B which are used as the trigger clocks for the input circuits 17 in the first chip 10.

The fourth embodiment shown in FIG. 19 has the same circuit structure as that of the first embodiment shown in FIG. 7 except that each input circuit 17 or 22 has a double circuit structure and the frequency dividers 202 and 204 are provided. In other words, the output circuits 12 and 27 in the individual chips output data signals at a high speed in response to the fast clocks N1 and N3, respectively. While the input circuits 17 and 22 in both chips need to fetch transferred data signals in synchronism with fast clocks, the latch operations of both input circuits are limited. In this respect, therefore, each of the input circuits 17 and 22 comprises two input circuits and the transfer clocks N6A and N6B, and N11B and N11A of low frequencies, which are acquired by frequency-dividing the reference clock N1, are used as the trigger clocks.

Figure 20:
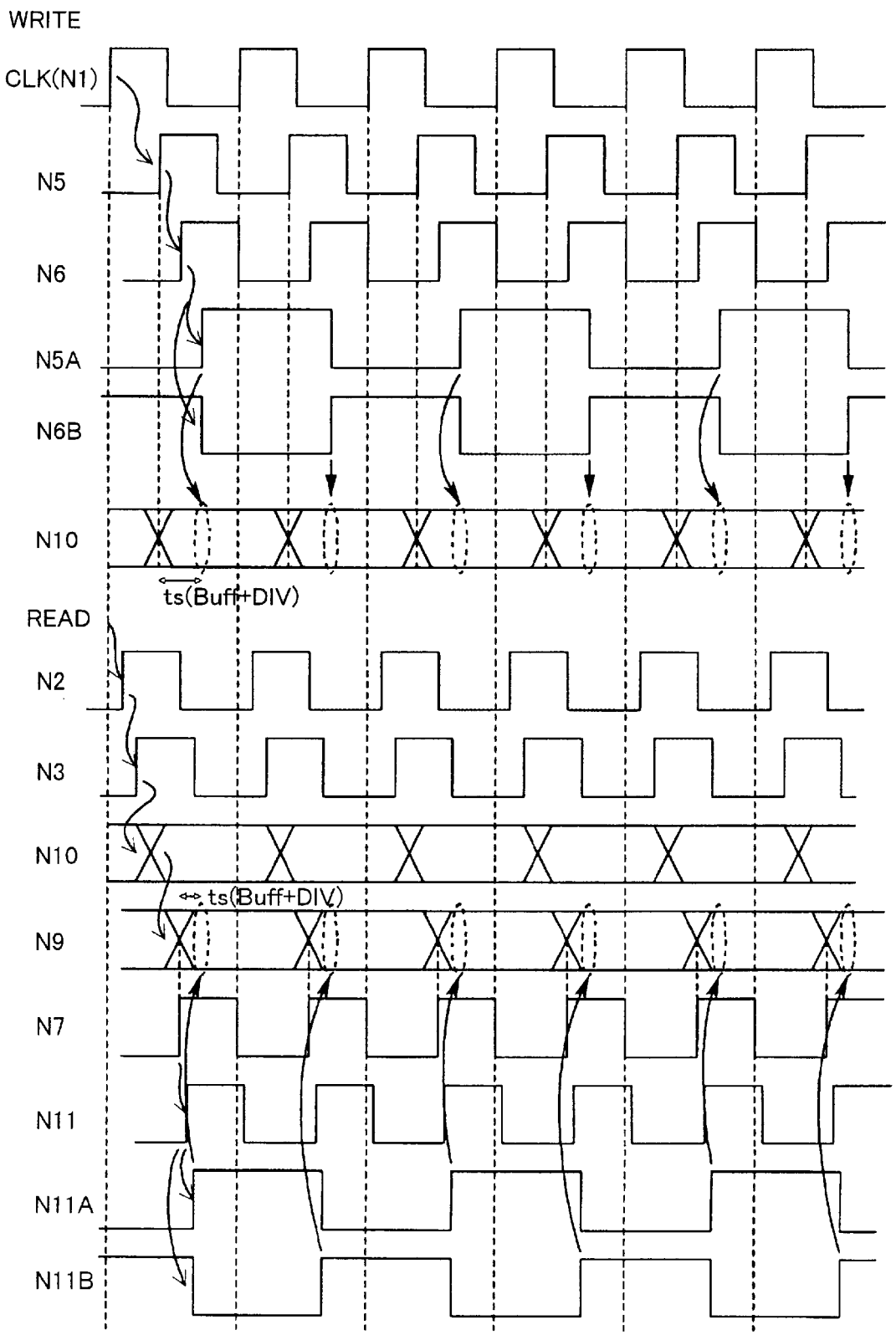
FIG. 20 is a timing chart for the fourth embodiment.

FIG. 20 is a timing chart for the fourth embodiment. the individual clocks N1 to N8 and N11 shown in FIG. 20 have the same timings as the clocks shown in FIG. 8. In the fourth embodiment, two transfer clocks N6A and N6B whose phases are shifted from each other by 180 degrees are generated from the transfer clock N6 by the frequency divider 204 in the write operation of transferring data signals to the second chip 20 from the first chip 10. In synchronism with the rising edges of the pair of transfer clocks N6A and N6B, one pair of input circuits A and B in each input circuit 22 in the second chip 20 fetch the supplied data signals and transfer them inside the chip alternately.

In the read operation of transferring data signals to the first chip 10 from the second chip 20, likewise, a pair of transfer clocks N11A and N11B whose phases are shifted from each other 180 degrees are generated by frequency-dividing the transfer clock N1, generated in the first chip 10, by the frequency divider 202. In response to the pair of transfer clocks N11A and N11B, the input latch circuits A and B in each input circuit 17 fetch the supplied data signals N9 and transfer them inside the second chip 20 alternately.

As apparent from FIG. 20, because one pair of input circuits A and B operate in response to one pair of transfer clocks whose frequencies are reduced by the associated frequency divider, data transfer between both chips can be performed in synchronism with the fast clock N1 even if the pair of input circuits A and B do not operate fast.

When each input circuit comprises three input circuits, three transfer clocks whose phases are shifted from one another by 120 degrees are generated by the associated frequency divider in the fourth embodiment. Generally speaking, when each input circuit comprises N input circuits, the transfer clock is divided by N by each frequency divider, yielding N transfer clocks whose phases are shifted from one another by 360/N degrees.

Figure 21:
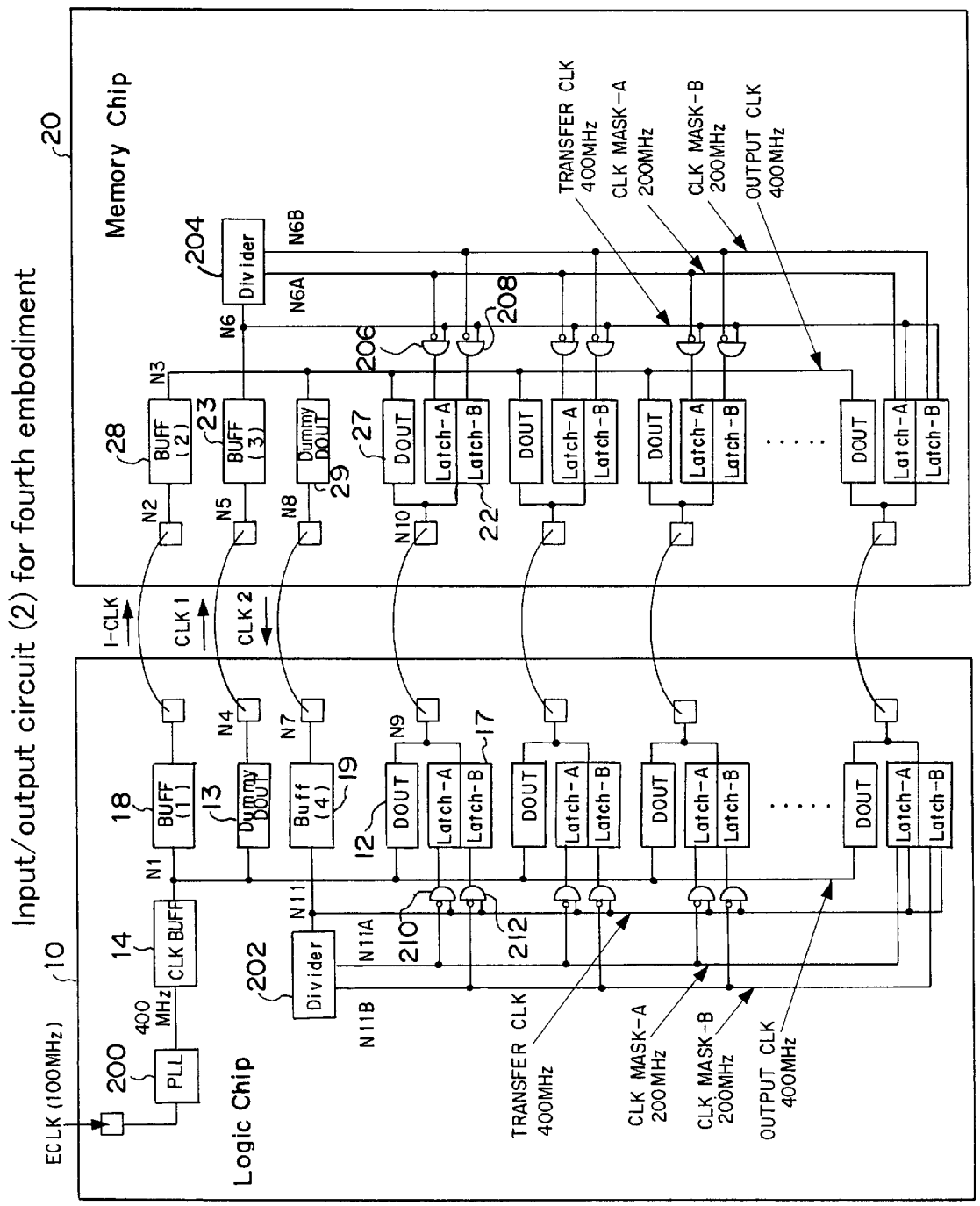
FIG. 21 is a diagram showing a modification of the fast input/output circuit according to the fourth embodiment.

FIG. 21 is a diagram showing a modification of the fast input/output circuit according to the fourth embodiment. In this modification, a faster clock is used in the fast input/output circuit of the first embodiment. Therefore, each of the input circuits 17 and 22 on the respective chips 10 and 20 has two input circuits. In the example shown in FIG. 21, two clock mask signals N6A and N6B whose phases are shifted from each other by 180 degrees are produced from the transfer clock N6 in the second chip 20 by the frequency divider 204. Likewise, two clock mask signals N11A and N11B whose phases are shifted from each other by 180 degrees are produced from the transfer clock N11 in the first chip 10 by the frequency divider 202. This modification differs from the example shown in FIG. 19 in that those frequency-divided clocks are uses as clock mask signals and the transfer clocks N6 and N11 control the input timings of the respective input circuits.

In the modification of FIG. 21, it is the transfer clock N6 that serves as the trigger clock for the input circuits 22 in the second chip 20. Likewise, the transfer clock N11 in the first chip 10 serves as the trigger clock for the input circuits 17. It is to be noted however that a pair of clock mask signals N6A and N6B and a pair of clock mask signals N11A and N11B, which are respectively generated by the frequency dividers 204 and 202, are used to supply the transfer clocks N6 and N11 to the respective pairs of input circuits A and B. For this purpose, AND gates 206 and 208 are provided at the preceding stage of the respective input circuits in the second chip 20, and AND gates 210 and 212 are provided at the preceding stage of the respective input circuits in the first chip 10.

Figure 22:
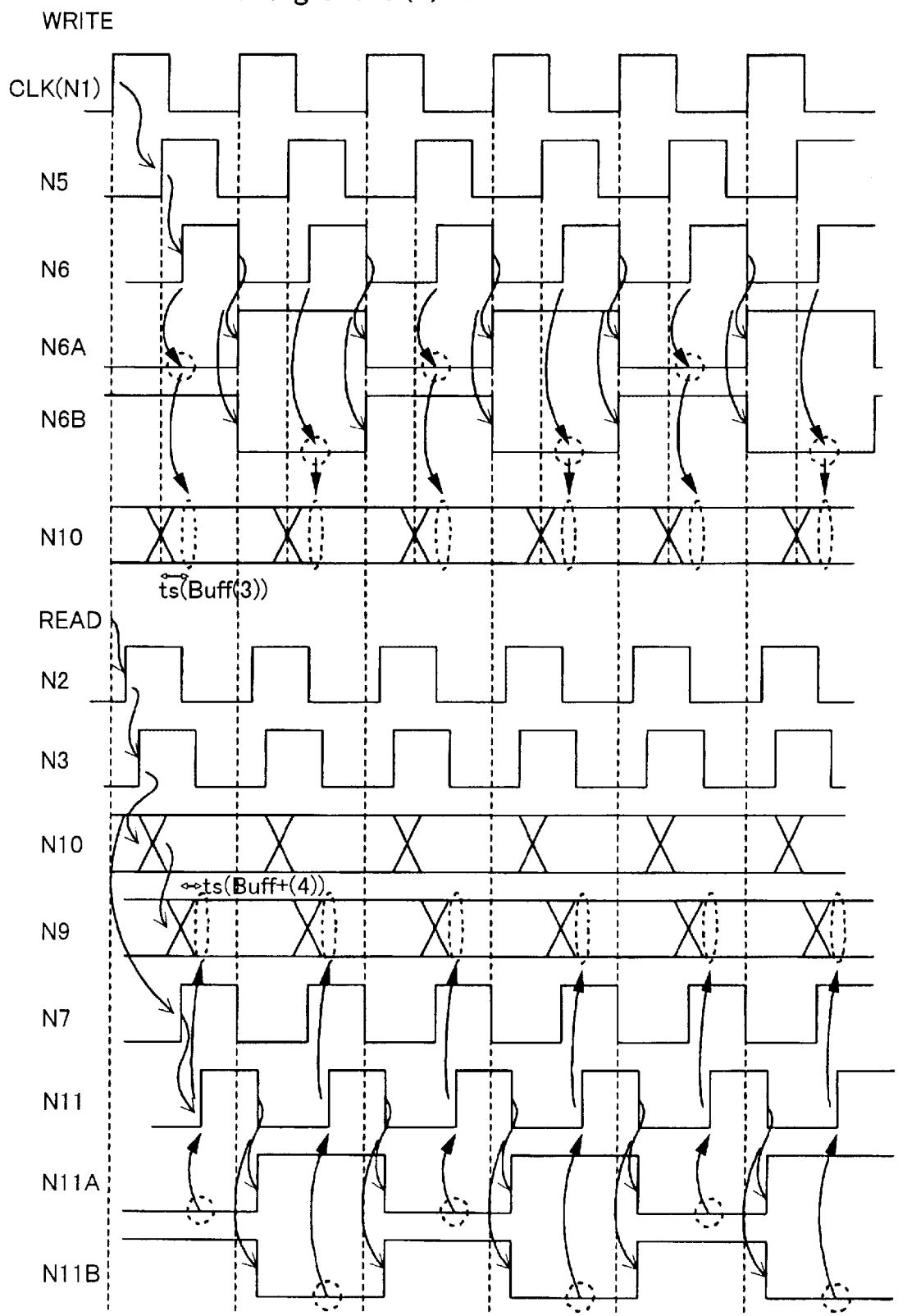
FIG. 22 is a timing chart for the modification of the fourth embodiment shown in FIG. 21.

FIG. 22 is a timing chart for the modification of the fourth embodiment shown in FIG. 21. A description will be given first on a case where data signals are transferred to the second chip 20 from the first chip 10 (write operation). The reference clock N1 and the clocks N5 and transfer clock N6, both generated from the clock N1, like those in FIG. 20, are the same as those in the first embodiment. Each input circuit 22 fetches the transferred data signal and transfers it inside the second chip 20 in synchronism with the rising edge of the transfer clock N6. In this case, the AND gate 206 or 208 supplies the transfer clock N6 to the input circuit that corresponds to the L-level clock mask signal N6A or N6B. Thus, the setup time of the input circuit 22 becomes equal to the delay time of the clock input buffer 23 as the first embodiment. The clock mask signals N6A and N6B vary in the frequency divider 204 in synchronism with the falling edge of the transfer clock N6. Therefore, the clock mask signals N6A and N6B are referred to in synchronism with the rising edge of the transfer clock N6 and the transfer clock N6 is supplied to the input circuit 22 when the clock mask signals N6A and N6B have L levels, and the clock mask signals N6A and N6B are switched in synchronism with the falling edge of the transfer clock N6.

A description will now be given on a case where data signals are transferred to the first chip 10 from the second chip 20 (read operation). In this case too, the clocks N2 and N3 with respect to the reference clock N1, like those in FIG. 20, are the same as those in the first embodiment. The AND gate 210 or 212 provided in the first chip 10 supplies the transfer clock N11 to the input circuit 17 that corresponds to the L-level clock mask signal N11A or N11B, in synchronism with the rising edge of the transfer clock N11. Further, the clock mask signals N11A and N11B are switched in the frequency divider 202 in synchronism with the falling edge of the transfer clock N11. As a result, the setup time ts of the input circuit in the read operation becomes equal to the delay time of the input buffer 19 as the first embodiment.

Figure 23:
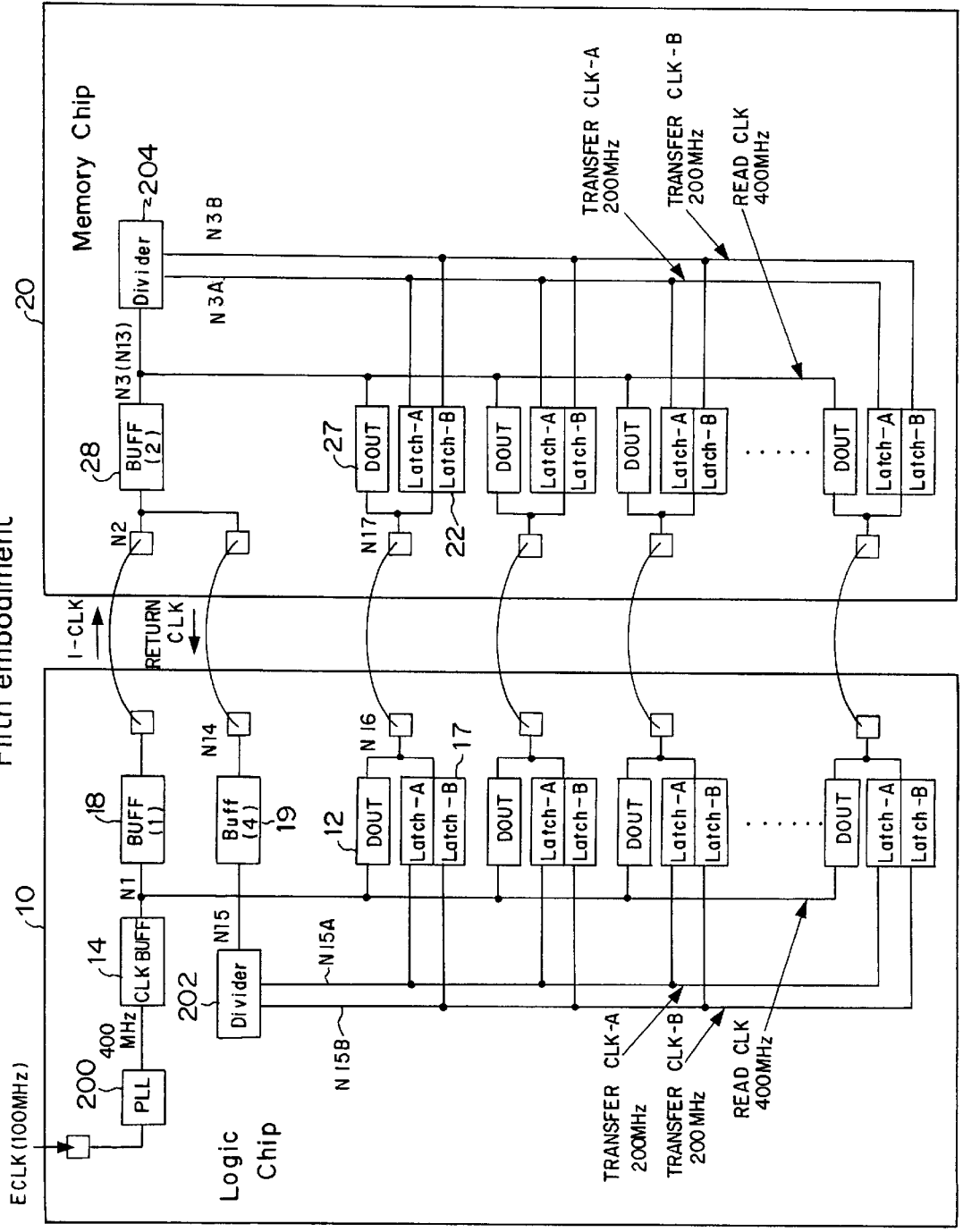
FIG. 23 is a diagram exemplifying a fast input/output circuit according to a fifth embodiment.

FIG. 23 is a diagram exemplifying a fast input/output circuit according to a fifth embodiment. This embodiment is the fourth embodiment shown in FIG. 19 adapted to the second embodiment shown in FIG. 14. That is, the frequency of the external clock ECLK is pulled up to four times or 400 MHz by the PLL circuit 200 in the first chip 10, and data signals are transferred between both chips 10 and 20 in synchronism with this fast reference clock N1.

The reference numerals in FIG. 23 correspond to those of the second embodiment illustrated in FIG. 14, with one difference lying in that the transfer clock N15 is frequency-divided by 2 in the frequency divider 202 in the first chip 10, generating two transfer clocks N15A and N15B whose phases are shifted from each other by 180 degrees. Likewise, the fifth embodiment differs from the second embodiment in that the transfer clock N3 is frequency-divided by 2 in the frequency divider 204 in the second chip 20, yielding two transfer clocks N3A and N3B whose phases are shifted from each other by 180 degrees. Each of the input circuits 17 and 22 comprises two input circuits as the fourth embodiments. Those two input circuits 17 in the first chip 10 fetch supplied data signals and transfer them inside the chip 10 in response to the transfer clocks N15A and N15B. In the second chip 20, likewise, the two input circuits 22 fetch supplied data signals and transfer them inside the chip 20 in response to the transfer clocks N3A and N3B.

The fifth embodiment shown in FIG. 23 may be modified like the modification of the fourth embodiment illustrated in FIG. 21. In other words, though not illustrated, each input circuit 22 can fetch the data signal in synchronism with the transfer clock N3 by using the clocks N3A and N3B, obtained by frequency-dividing the transfer clock N3, as clock mask signals. A similar structure may be taken in the first chip 10.

Figure 24:
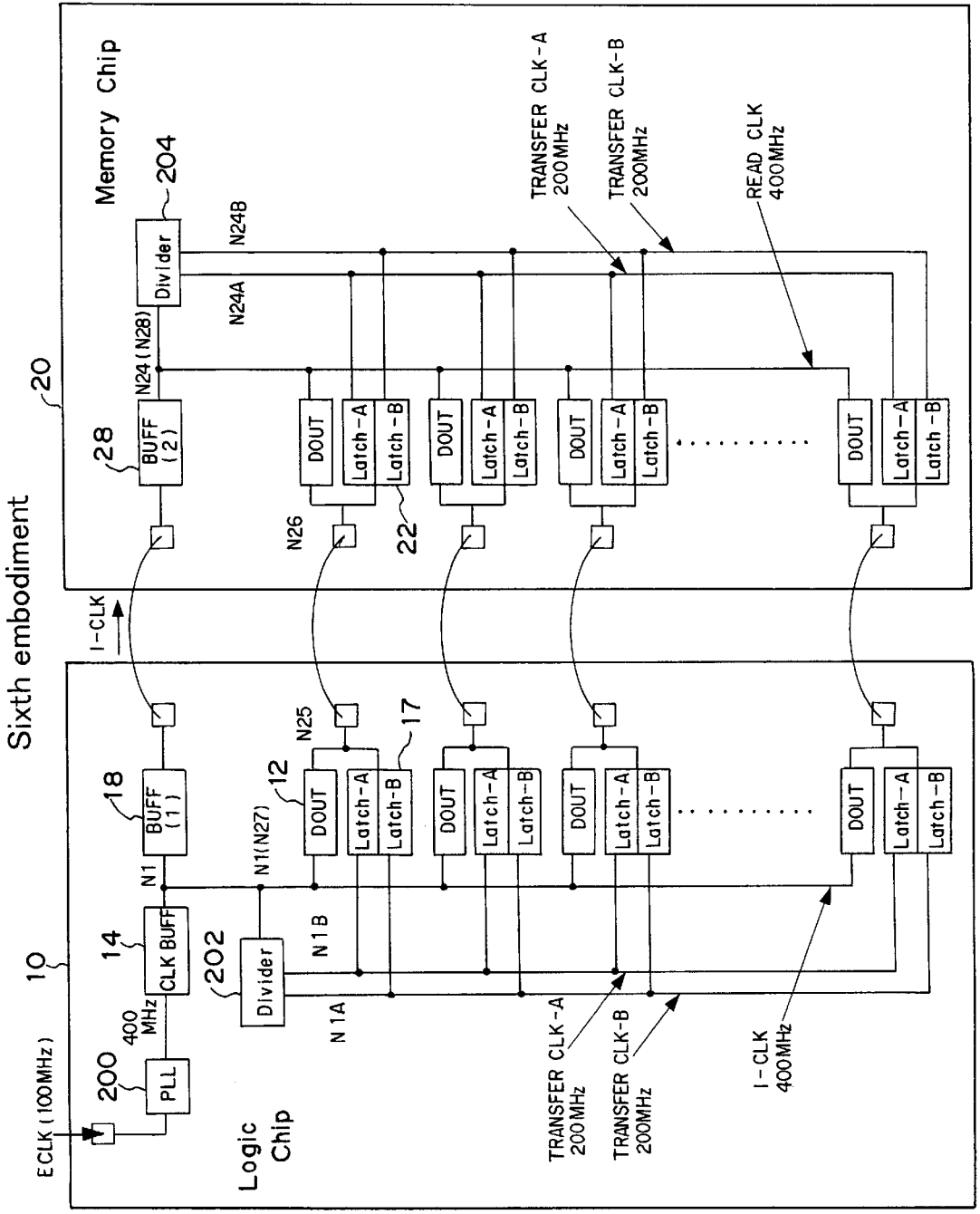
FIG. 24 is a diagram exemplifying a fast input/output circuit according to a sixth embodiment.
Figure 25:
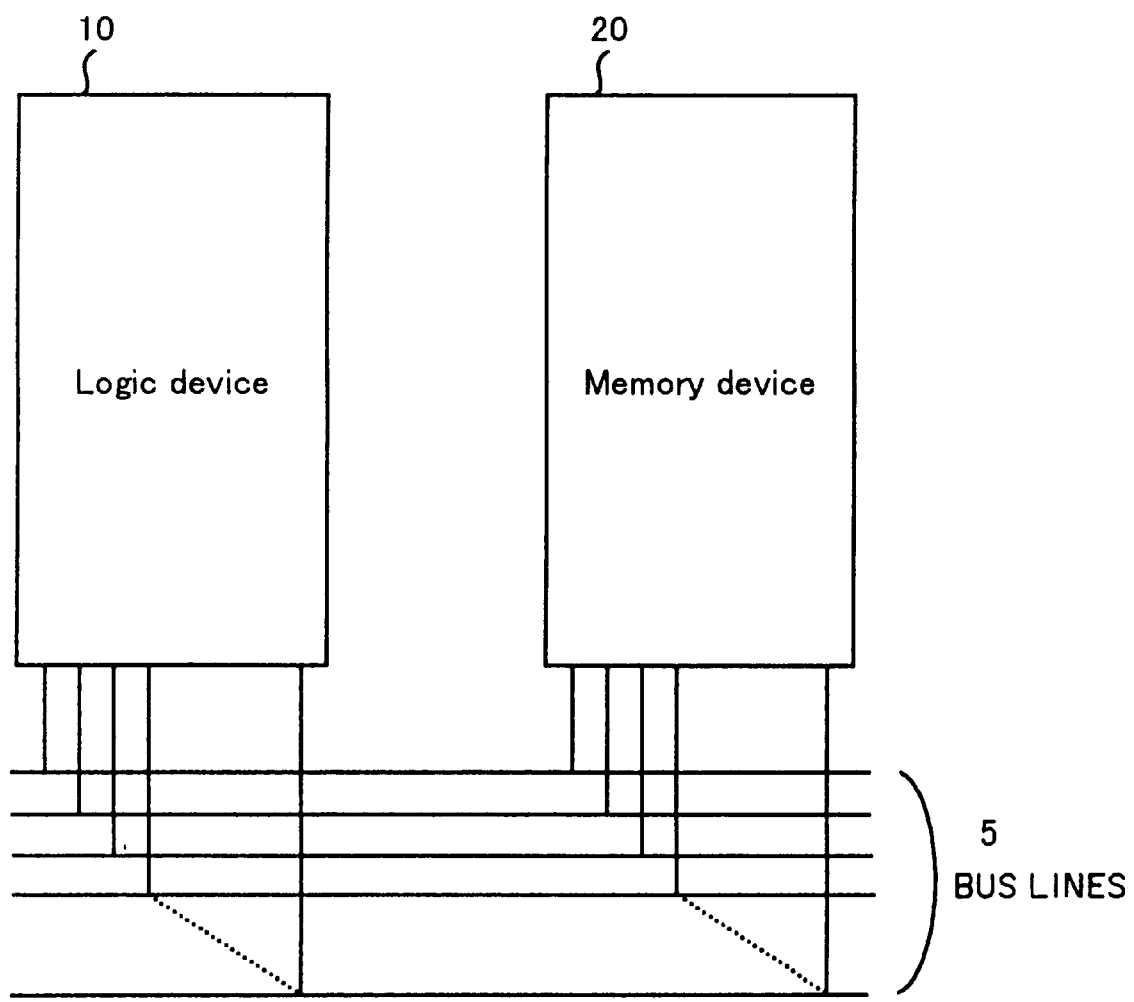
FIG. 25 is a diagram showing a conventional structure which has a logic device a memory device connected together.
Figure 26:
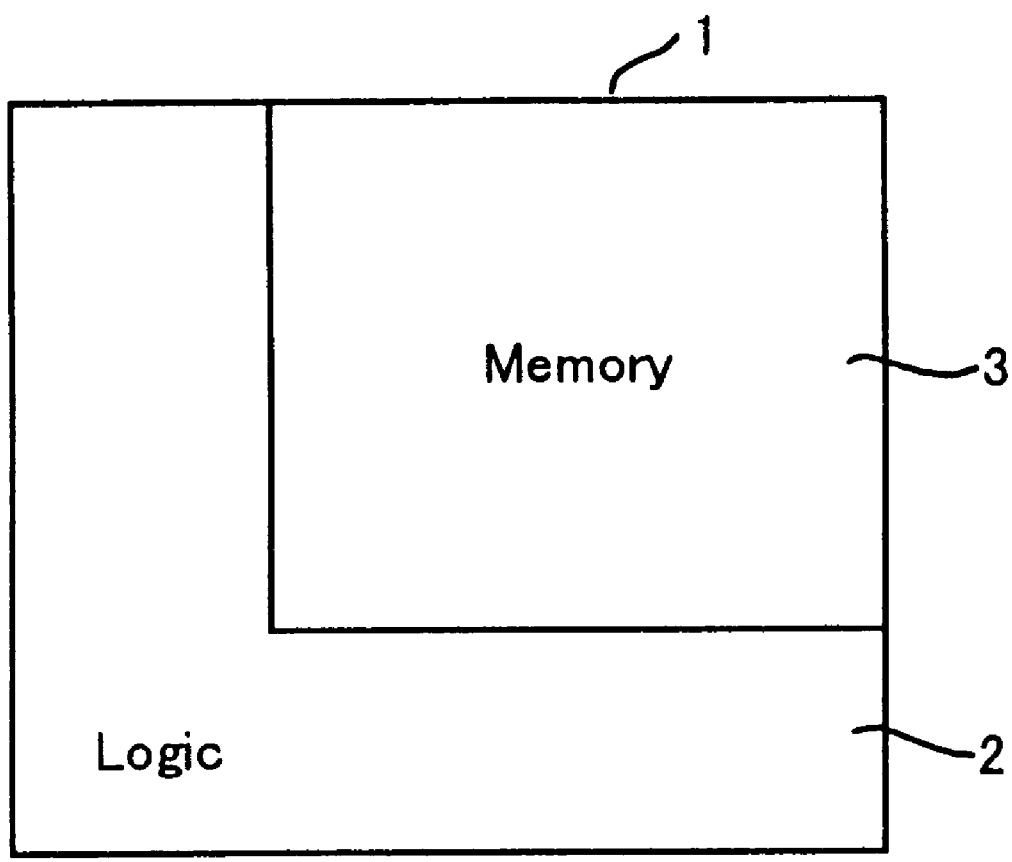
FIG. 26 is a diagram depicting the structure of a system LSI which has a logic section 2 and a memory section 3 embedded in a single chip.

FIG. 24 is a diagram exemplifying a fast input/output circuit according to a sixth embodiment. This embodiment is the fourth embodiment shown in FIG. 19 adapted to the third embodiment shown in FIG. 17. That is, the frequency of the external clock ECLK is pulled up to four times or 400 MHz by the PLL circuit 200 in the first chip 10, and data signals are transferred between both chips 10 and 20 based on the fast clock N1. In the first chip 10, the transfer clock Ni is frequency-divided by the frequency divider 202, generating new transfer clocks N1A and N1B whose phases are shifted from each other by 180 degrees. In the second chip 20, likewise, the transfer clock N24 is frequency-divided by the frequency divider 204, generating new transfer clocks N24A and N24B whose phases are shifted from each other by 180 degrees. In response to those frequency-divided transfer clocks, a pair of input circuits A, B in each of the input circuits 17 and 22 fetch transferred data signals and transfer them inside the respective chip.

The sixth embodiment in FIG. 24 may be modified like the modification of the fourth embodiment shown in FIG. 21. In other words, though not illustrated, the input circuits 17 in the first chip 10 which correspond to the L-level clock mask signals N1A and N1B fetch data signals and transfer them inside the chip 10 in response to the timing of the transfer clock N1. In the second chip 20, likewise, the input circuits 22 which correspond to the L-level clock mask signals N24A and N24B fetch data signals and transfer them inside the chip 20 in response to the timing of the transfer clock N24.

As apparent from the above description, the first to third embodiments can transfer data signals between both chips in synchronism with a fast clock by utilizing frequency dividers as in the fourth to sixth embodiments.

According to this invention, as described above, two chips are connected together by lead lines, and the trigger clocks for the input/output circuits in both chips are generated from a reference clock in one of the chips, whereby fast transfer of data signals between both chips can be implemented in synchronism with the reference clock. The manufacturing cost can be reduced by fabricating both chips in their optimal processes.

What is claimed is:

1. An LSI device on which a first chip and a second chip to be connected by lead lines are mounted,
   said first chip having an output circuit for outputting a data signal in response to an output clock, and a data output terminal connected to said output circuit,
   said second chip having an input circuit receiving said data signal, output from said output circuit, in response to a transfer clock generated from said output clock and sent to said second chip via a lead line for clock, and a data input terminal connected to said input circuit,
   said data output terminal in said first chip and said data input terminal in said second chip being arranged on opposing sides of both chips and being connected together via a lead line for data.

2. The LSI device according to claim 1, wherein a plurality of the output circuits, a plurality of the data output terminals to be respectively connected to said plurality of output circuits, and an output clock line for supplying said output clock to said plurality of output circuits are arranged in said first chip;
   a plurality of the input circuits, a plurality of the data input terminals to be respectively connected to said plurality of input circuits, and a transfer clock line for supplying said transfer clock to said plurality of input circuits are arranged in said second chip; and
   said plurality of data output terminals are connected to said plurality of data input terminals via respective lead lines for data.

3. The LSI device according to claim 2, wherein said output clock line and said transfer clock line have clock transfer line portions arranged along said output circuits and said input circuits, and supply nodes, located at nearly middle portions of said clock transfer line portions, to which said output clock and said transfer clock are respectively supplied.

4. The LSI device according to claim 2, wherein said output clock line and said transfer clock line have supply nodes to which said output clock and said transfer clock are respectively supplied, and clock transfer line portions of approximately same lengths extending from said supply nodes to said output circuits and said input circuits, respectively.

5. The LSI device according to claim 1 or 2, wherein a dummy output delay circuit for delaying said output clock by about the same amount as said output circuit and a clock output terminal connected to said dummy output delay circuit are provided in said first chip;

a clock input terminal to be connected to said clock output terminal via said lead line for clock and a clock buffer, connected to said clock input terminal, for outputting said transfer clock are provided in said second chip; and said data signal output from said output circuit in response to said output clock is input to said data input terminal in said second chip, after that, said input circuit inputs said data signal in response to said transfer clock.

6. The LSI device according to claim 1 or 2, wherein a first clock buffer for outputting said output clock and a clock output terminal connected to said first clock buffer are provided in said first chip;

a clock input terminal to be connected to said clock output terminal via said lead line for clock and a second clock buffer, connected to said clock input terminal, for outputting said transfer clock are provided in said second chip; and said input circuit inputs said data signal in response to said transfer clock, after that, said data signal output from said output circuit in response to said output clock is input to said data input terminal in said second chip.

7. The LSI device according to claim 1, or 2, wherein said input circuit has N input sections respectively; and said second chip has a frequency divider for frequency-dividing a frequency of said transfer clock by N, thereby generating N frequency-divided clocks whose phases are shifted from one another by 360/N degrees, and said N input sections input said data signal in response to said N frequency-divided clocks, respectively.

8. The LSI device according to claim 1, or 2, wherein said input circuit has N input sections respectively; and said second chip has a frequency divider for frequency-dividing a frequency of said transfer clock by N, thereby generating N frequency-divided clocks whose phases are shifted from one another by 360/N degrees, and said N input sections corresponding to said N frequency-divided clocks input said data signal in response to said transfer clock.

9. An LSI device on which a first chip and a second chip to be connected by lead lines are mounted, said first chip having an input circuit for inputting a data signal from said second chip in response to a transfer clock in said first chip, and a data input terminal connected to said input circuit, said second chip having an output circuit for outputting a data signal in said second chip to said input circuit in response to an output clock generated from said transfer clock and sent to said second chip via a lead line for clock, and a data output terminal connected to said output circuit, said data input terminal in said first chip and said data output terminal in said second chip being arranged on opposing sides of both chips and being connected together via a lead line for data.

10. The LSI device according to claim 9, wherein a plurality of the input circuits, a plurality of the data input terminals to be respectively connected to said plurality of input circuits, and a transfer clock line for supplying said transfer clock to said plurality of input circuits are arranged in said first chip;

a plurality of the output circuits, a plurality of the data output terminals to be respectively connected to said plurality of output circuits, and an output clock line for supplying said output clock to said plurality of output circuits are arranged in said second chip; and said plurality of data output terminals are connected to said plurality of data input terminals via respective lead lines for data.

11. The LSI device according to claim 10, wherein said output clock line and said transfer clock line have clock transfer line portions arranged along said output circuits and said input circuits, and supply nodes, located at nearly middle portions of said clock transfer line portions, to which said output clock and said transfer clock are respectively supplied.

12. The LSI device according to claim 10, wherein said output clock line and said transfer clock line have supply nodes to which said output clock and said transfer clock are respectively supplied, and clock transfer line portions of approximately same lengths extending from said supply nodes to said output circuits and said input circuits, respectively.

13. The LSI device according to claim 9 or 10, wherein a first output buffer for outputting said transfer clock to said second chip, and a first input buffer for receiving a transfer clock returned from said second chip are provided in said first chip;

a second input buffer, connected via said lead line for clock to said first output buffer, for receiving said transfer clock, and a dummy output delay circuit for delaying said transfer clock, input to said second input buffer, by about the same amount as said output circuit and returning said transfer clock to said first input buffer are provided in said second chip; and said data signal output from said output circuit in response to said output clock is input to said data input terminal in said first chip, after that, said input circuit inputs said data signal in response to said transfer clock input to said first input buffer.

14. The LSI device according to claim 9 or 10, wherein a first output buffer for outputting said transfer clock to said second chip, and a first input buffer for receiving a transfer clock returned from said second chip are provided in said first chip;

a clock input terminal to be connected to said first output buffer via said lead line for clock, and a second input buffer for receiving said transfer clock input to said clock input terminal and generating said output clock are provided in said second chip, said transfer clock input to said clock input terminal being returned to said first chip; and said input circuit inputs said data signal in response to said transfer clock input to said first input buffer, after that, said data signal output from said output circuit in response to said output clock generated by said second input buffer is input to said data input terminal in said first chip.

15. The LSI device according to claim 9 or 10, wherein a first output buffer for outputting said transfer clock to said second chip is provided in said first chip;

a second input buffer, connected to said first output buffer via said clock lead line, for receiving said transfer clock and generating said output clock are provided in said second chip; and said input circuit receives said data signal in response to said transfer clock, after which said data signal output from said output circuit is input to said data input terminal in said first chip in response to said output clock generated by said second input buffer.

16. The LSI device according to claim 9, or 10, wherein said input circuit has N input sections respectively; and said first chip has a frequency divider for frequency-dividing a frequency of said transfer clock by N, thereby generating N frequency-divided clocks whose phases are shifted from one another by 360/N degrees, and said N input sections input said data signal in response to said N frequency-divided clocks, respectively.

17. The LSI device according to claim 9, or 10, wherein said input circuit has N input sections respectively; and said first chip has a frequency divider for frequency-dividing a frequency of said transfer clock by N, thereby generating N frequency-divided clocks whose phases are shifted from one another by 360/N degrees, and said N input sections corresponding to said N frequency-divided clocks input said data signal in response to said transfer clock.

18. An LSI device on which a first chip and a second chip to be connected by lead lines are mounted, said first chip comprising a first data input/output terminal to be supplied with a data signal, and a first input/output circuit, connected to said first data input/output terminal, for outputting a data signal in said first chip to said first data input/output terminal in response to a first output clock in said first chip, and inputting said data signal supplied to said first data input/output terminal and transferring said data signal inside in response to a first transfer clock in said first chip, said second chip comprising a second data input/output terminal to be supplied with a data signal, and a second input/output circuit, connected to said second data input/output terminal, for outputting a data signal in said second chip to said second data input/output terminal in response to a second output clock in said second chip, and inputting said data signal supplied to said second data input/output terminal and transferring said data signal inside in response to a second transfer clock in said second chip, said first output clock and said first transfer clock being generated from a reference clock in said first chip, said reference clock being transferred via said lead lines to said second chip to thereby generate said second output clock and said second transfer clock, said first data input/output terminal in said first chip and said second data input/output terminal in said second chip being arranged on opposing sides of both chips and being connected together via a data lead line.

19. The LSI device according to claim 18, wherein said first chip has a logic circuit and said second chip has a memory circuit.

20. The LSI device according to claim 18 or 19, wherein said first and second chips are mounted in a common package.

* * * * *